(12) United States Patent
Matsumoto et al.

(10) Patent No.: US 6,774,435 B1
(45) Date of Patent: Aug. 10, 2004

(54) SEMICONDUCTOR WAFER AND SEMICONDUCTOR DEVICE COMPRISING GETTERING LAYER

(75) Inventors: Takuji Matsumoto, Hyogo (JP); Toshiaki Iwamatsu, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/448,482

(22) Filed: Nov. 24, 1999

(30) Foreign Application Priority Data

Jun. 11, 1999 (JP) ............................................. 11-165951

(51) Int. Cl.⁷ ............................................... H01L 27/01
(52) U.S. Cl. ..................................................... 257/347
(58) Field of Search ................................. 257/347, 349, 257/353, 66, 67, 70, 913; 438/446, 448

(56) References Cited

U.S. PATENT DOCUMENTS

| | | | |
|---|---|---|---|
| 3,929,529 A | * 12/1975 | Poponiak | |
| 5,138,421 A | 8/1992 | Saito | |
| 5,164,323 A | * 11/1992 | Brehm et al. | |
| 5,298,449 A | * 3/1994 | Kikuchi | |
| 5,572,040 A | * 11/1996 | Reedy et al. | |
| 5,679,475 A | * 10/1997 | Yamagata et al. | |
| 5,726,462 A | * 3/1998 | Spahn et al. | |
| 5,773,152 A | * 6/1998 | Okonogi | |
| 5,930,642 A | * 7/1999 | Moore et al. | |
| 6,083,324 A | * 7/2000 | Henley et al. | |
| 6,091,112 A | * 7/2000 | Kwon | |
| 6,362,027 B1 | * 3/2002 | Yamazaki et al. | |

FOREIGN PATENT DOCUMENTS

| | | |
|---|---|---|
| DE | 19757269 A1 | 7/1998 |
| EP | 0822588 A2 | 2/1998 |
| JP | 60-148128 | 8/1985 |
| JP | 4-72631 | 3/1992 |
| JP | 8-116038 | 5/1996 |
| JP | 8-139295 | 5/1996 |
| WO | WO 94/15359 | 7/1994 |
| WO | WO 99/26291 | * 5/1999 |

OTHER PUBLICATIONS

"Smart-Cut®: The Basic Fabrication Process for UNI-BOND® SOI Wafers", by Auberton-Herve et al., IEICE Trans Electron, vol. E80-C, No. 3, Mar. 1997, pp. 258-363.

"Current Progress in Epitaxial Layer Transfer (ELT-RAN®)", by Sakaguchi et al., IEICE Trans Electron, vol. E80-C, No. 3, Mar. 1997, pp. 378-387.

"SOI Structure Fabrication Technique", by Siejiro Furukawa, Industrial Library, Oct. 23, 1987, pp. 176-192 (with partial English translation).

* cited by examiner

Primary Examiner—Nathan J. Flynn
Assistant Examiner—Kevin Quinto
(74) Attorney, Agent, or Firm—McDermott Will & Emery LLP

(57) ABSTRACT

A semiconductor wafer includes an oxide film above a silicon layer, and a porous silicon layer which is located above the oxide film and serves as a gettering layer. Gettering of impurities from a silicon layer is not interrupted by the oxide film since the porous silicon layer is placed above the oxide film. The semiconductor wafer having the structure above can be produced by a bonding method. Bonding strength relative to the oxide film is ensured by placing a growth silicon layer between the oxide film and the porous silicon layer, compared with the case in which the oxide film and the porous silicon layer are directly bonded.

14 Claims, 21 Drawing Sheets

SEMICONDUCTOR WAFER AND SEMICONDUCTOR DEVICE COMPRISING GETTERING LAYER

BACKGROUND OF THE INVENTION

1. Field of the Invention

The present invention generally relates to gettering technique applied to a semiconductor wafer having an SOI (Silicon On Insulator) structure (hereinafter referred to as SOI wafer). Gettering is a process of removing from a device region heavy metal impurities such as Fe, Cu, Cr, Ni and Pt that have an adverse effect on the characteristics of a semiconductor device.

2. Description of the Background Art

Referring to FIG. 58, a bulk silicon wafer is usually formed by depositing on the back of a wafer formed of a silicon layer 1 a polycrystalline silicon layer 9 which serves as a gettering layer.

SOI wafer has been attracting attention as a silicon substrate of the next generation since SOI is effective in preventing the short channel effect and CMOS (Complementary Metal-Oxide Semiconductor) latchup that are found problematic as the semiconductor device is further decreased in size, and it achieves a high speed operation even in a low voltage region. Referring to FIG. 59, SOI wafer has a structure in which an oxide film 2 is placed between an upper silicon layer 1 where a semiconductor device is formed and substrate formed of a lower silicon layer 3 or the like. Oxide film 2 is referred to as a buried oxide film in some cases.

The gettering technique has an increasing importance for ensuring reliability of the semiconductor device, and thus improvement of the gettering ability is demanded.

However, the structure of the SOI wafer is not suitable for applying gettering thereto since oxide film 2 located between the upper silicon layer 1 and the gettering layer on the back prevents heavy metal from diffusing.

There is thus a problem of difficulty in executing gettering in the SOI wafer regardless of the demand for improvement of the gettering ability so as to enhance the reliability of the semiconductor device.

SUMMARY OF THE INVENTION

One object of the present invention is to provide an SOI wafer having improved gettering ability and a method of manufacturing thereof.

In order to achieve the object above, according to one aspect of the present invention, a semiconductor wafer has a gettering layer which includes a porous silicon layer.

The structure above is employed to enable a dangling bond portion of a vacancy within the porous silicon layer to function as a gettering site.

The semiconductor wafer according to the present invention preferably includes an insulating film.

The structure above is employed to implement an SOI structure having a silicon layer on the insulating film. As a result, the gettering ability can be enhanced in the wafer having the SOI structure (SOI wafer).

The semiconductor wafer according to the invention preferably has the gettering layer located above the insulating film.

By employing such a structure, gettering from the silicon layer is not interrupted by an oxide film serving as the insulating film since the gettering layer is located above the oxide film. Therefore, although it was difficult to execute gettering in the SOI wafer, the gettering ability can be enhanced in that way.

According to the invention above, preferably the porous silicon layer is in contact with the upper side of the insulating film.

By employing such a structure, the manufacturing process can be simplified since a step of forming a silicon layer between the oxide film and the porous silicon layer can be omitted.

The porous silicon layer serving as a gettering layer can be arranged away from the upper surface where the semiconductor device is located, and thus the influence of heavy metal on the semiconductor device can be reduced.

The semiconductor wafer according to the invention preferably includes a silicon layer which is in contact with the lower side of the gettering layer and in contact with the upper side of the insulating film.

By employing such a structure, the silicon layer and the oxide film can be bonded instead of the porous silicon layer and the oxide film and accordingly, bonding strength can be enhanced.

According to a preferred aspect of the invention, the semiconductor wafer has a two-layer structure constituted of a first gettering layer formed of a porous silicon layer and a second gettering layer formed of a polycrystalline silicon layer having a high concentration impurity region or a low concentration impurity region or formed of a layer containing crystal defect, and the two-layer structure is in contact with the upper side of the oxide film.

By employing such a structure as described above, gettering is carried out by a gettering layer having the two-layer structure and thus an SOI wafer having its gettering ability improved is achieved.

According to another aspect of the invention, the semiconductor wafer has the gettering layer located below the insulating film.

By employing such a structure as described above, the gettering ability can be applied to heavy metal which is diffused via the oxide film as an insulating film. Especially, if the oxide film has a relatively small thickness, the barrier function of the oxide film relative to the heavy metal is not fully exercised. In this case, the structure having the gettering layer under the oxide film is particularly advantageous. Accordingly, the gettering ability can be applied to heavy metal diffused in an SOI wafer having a thin oxide film.

According to still another aspect of the invention, the gettering layer in the semiconductor wafer has a two-layer structure constituting of a first gettering layer formed of a porous silicon layer and a second gettering layer formed of a polycrystalline silicon layer having a high concentration impurity region or a low concentration impurity region or formed of a crystal defect containing layer, and the gettering layer is in contact with the lower side of the oxide film.

By employing such a structure as described above, the gettering ability can be applied to heavy metal which is diffused in the SOI wafer having a thin oxide film. Further, the gettering ability can be enhanced since the gettering layer has the two-layer structure.

According to another preferred aspect of the invention, the gettering layer is formed of a low concentration impurity layer, and a polycrystalline silicon layer or a single crystal silicon layer which is in contact with the lower side of the low concentration impurity layer and has a thickness of about 0.01 µm to 3 µm. The polycrystalline silicon layer has a high concentration impurity region containing impurities of high concentration that define n-type or p-type such as phosphorus, arsenic, antimony, boron and indium or a low concentration impurity region containing impurities of low concentration such as those listed above. The single crystal silicon layer contains those impurities of high concentration. The gettering layer is in contact with the lower side of the insulating film.

By employing such a structure as described above, the polycrystalline silicon layer having the high concentration impurity region containing impurities of high concentration which define n- or p-type or the low concentration impurity region containing those impurities of low concentration, or the single crystal silicon layer containing those impurities of high concentration has a sufficiently small thickness of about 0.01 µm to 3 µm. The interface between layers functions as a gettering site. Therefore, particularly in this structure, the interface between those layers functions effectively as a gettering site since each layer is thin. In this way, this structure can improve the gettering ability.

The low concentration impurity region is placed between the oxide film and the polycrystalline silicon layer having the high concentration impurity region or the low concentration impurity region or the single crystal silicon layer containing those impurities of high concentration. Accordingly, the influence of impurities diffused in high-temperature process on the silicon layer constituting the semiconductor device can be prevented.

According to a further aspect of the invention, the gettering layer includes a back side porous silicon layer placed on the back side of the semiconductor wafer.

By employing this structure, a semiconductor wafer with improved gettering ability is achieved.

According to a further aspect of the invention, the gettering layer includes a back side two-layer structure placed on the back side of the semiconductor wafer that is constituted of a first gettering layer formed of the back side porous silicon layer and a second gettering layer formed of a polycrystalline silicon layer having a high concentration impurity region containing impurities of high concentration that define n- or p-type such as phosphorous, arsenic, antimony, boron and indium or having a low concentration impurity region containing those impurities of low concentration or formed of a crystal defect containing layer.

By employing such a structure, a semiconductor wafer having improved gettering ability can be obtained. In addition, the two-layer structure of the gettering layer further improves the gettering ability.

According to a further aspect of the invention, the porous silicon layer is placed in a selected region.

By employing such a structure, bonding strength can be reinforced between the porous silicon layer and the oxide film, since bonding is made not only between the oxide film and the porous silicon layer but between the oxide film and both of the silicon layer and the porous silicon layer.

According to a further aspect of the invention, the semiconductor wafer has a gettering layer including a polycrystalline silicon layer containing impurities of low concentration of $1\times10^{18}$ cm$^{-3}$ or less, and has an insulating film. The gettering layer is in contact with the lower side of the insulating film.

By employing the structure above, the gettering ability can be improved and enhancement is accomplished in prevention of junction leakage, reliability of the oxide film, and yield as compared with a silicon wafer according to the conventional technique. In addition, the thickness of the oxide film as well as parasitic capacity can be decreased, although it is impossible when the high concentration impurity layer is provided. In this case, no influence is exerted on the silicon area where the semiconductor device is formed.

According to the present invention, a semiconductor device is implemented on the semiconductor wafer as described above.

By employing the structure above, the semiconductor device is implemented using the SOI wafer with improved gettering ability, so that a semiconductor device of a high reliability is achieved.

According to one aspect of the invention, a method of manufacturing a semiconductor wafer employs a bonding method which includes the steps of fabricating an upper wafer by forming a porous silicon layer on the upper surface of a silicon layer, turning the upper wafer upside down and overlaying it on a lower wafer formed of a silicon layer with an insulating film placed on its upper surface to bond the upper and lower wafers together, and removing an upper portion of the silicon layer which constitutes the upper wafer leaving a desired amount thereof so as to reduce the thickness of the upper wafer.

By employing those steps, an SOI wafer formed of multiple layers with improved gettering ability can be manufactured efficiently.

According to another aspect of the invention, a method of manufacturing a semiconductor wafer employs a bonding method including the steps of fabricating an upper wafer by a) forming a porous silicon layer on the upper surface of a silicon layer and b) forming a first epitaxial silicon layer on the upper surface of the porous silicon layer through epitaxial growth, turning the upper wafer upside down and overlaying it on a lower wafer formed of a silicon layer with an insulating film placed on its upper surface, and removing an upper portion of the silicon layer which constitutes the upper wafer leaving a desired amount thereof so as to reduce the thickness of the upper wafer.

By employing those steps, bonding strength can be enhanced since bonding is made not between the porous silicon layer and the oxide film but between the first epitaxial silicon layer and the oxide film.

Preferably, the invention described above is characterized in that the bonding method follows a hydrogen implantation separation method.

By employing such an arrangement, the cost can be reduced compared with the method to reduce the thickness of the wafer by polishing, since the separated portion of the silicon substrate can be recycled.

According to still another aspect of the invention, a method of manufacturing a semiconductor wafer employs a bonding method which includes the steps of fabricating an upper wafer by a) forming a first porous silicon layer which is in contact with the upper surface of a silicon layer, b) forming a first epitaxial silicon layer which is in contact with the upper surface of the first porous silicon layer through epitaxial growth, c) forming a second porous silicon layer which is in contact with the upper surface of the first epitaxial silicon layer, and d) forming an oxide film on the upper surface of the second porous silicon layer, turning the upper wafer upside down and overlaying it on a lower wafer formed of a silicon layer to bond the upper and lower wafers together, and removing an upper portion of the upper wafer leaving a desired amount thereof.

By employing those steps, an SOI wafer formed of multiple layers with improved gettering ability can be manufactured easily and efficiently even when the lower wafer formed only of the silicon layer is used.

According to a further aspect of the invention, a method of manufacturing a semiconductor wafer employs a bonding method which includes the steps of fabricating an upper wafer by a) forming a first porous silicon layer which is in contact with the upper surface of a silicon layer, b) forming a first epitaxial silicon layer which is in contact with the upper surface of the first porous silicon layer through epitaxial growth, c) forming a second porous silicon layer which is in contact with the upper surface of the first epitaxial silicon layer, d) forming a second epitaxial silicon layer which is in contact with the upper surface of the second porous silicon layer through epitaxial growth, and e) forming an oxide film on the upper surface of the second epitaxial silicon layer, turning the upper wafer upside down and overlaying it on a lower wafer formed of a silicon layer to bond the upper and lower wafers together, and removing an upper portion of the upper wafer leaving a desired amount thereof so as to reduce the thickness of the upper wafer.

By employing those steps, an SOI wafer having at least two silicon layers formed through the epitaxial growth to improve gettering ability can be manufactured easily and efficiently.

Preferably, according to the invention, in the steps of forming the first and second porous silicon layers respectively, density of vacancies in one of the first and second porous silicon layers is made higher than that in the other, and in the removing step, one of the first and second porous silicon layers that has a higher density of vacancies is separated.

By employing such steps, separation is more likely to occur in one of the layers having a higher vacancy density than the other, so that the position where separation occurs can be controlled. As a result, an SOI wafer having improved gettering ability owing to the bonding method can be manufactured easily and efficiently.

According to a further aspect of the invention, the method of manufacturing a semiconductor wafer is characterized in that the porous silicon layer or at least one of the first and second porous silicon layer is placed in a selected region.

By employing such a step, not only the porous silicon layer but both of the porous silicon layer and the silicon layer are joined with the upper surface of the oxide film, so that an SOI wafer with improved gettering ability can be manufactured without deterioration of bonding strength.

According to a further aspect of the invention, a method of manufacturing a semiconductor wafer employs a bonding method which includes the steps of fabricating a lower wafer by forming a porous silicon layer on the upper surface of a silicon layer, turning upside down an upper wafer formed of a silicon layer with an oxide film placed on its upper surface and overlaying the upper wafer on the lower wafer to bond the upper and lower wafers together, and removing an upper portion of the silicon layer which constitutes the upper wafer leaving a desired amount thereof so as to reduce the thickness of the upper wafer.

By employing those steps, an SOI wafer formed of multiple layers having improved gettering ability can be manufactured easily and efficiently.

According to a further aspect of the invention, a method of manufacturing a semiconductor wafer employs a bonding method which includes the steps of fabricating an upper wafer by implementing on the upper surface of a silicon layer a two-layer structure constituted of a first gettering layer formed of a porous silicon layer and a second gettering layer formed of a polycrystalline silicon layer which has a high concentration impurity region or a low concentration impurity region or formed of a crystal defect containing layer, turning the upper wafer upside down and overlaying it on a lower wafer formed of a silicon layer having an oxide film on its upper surface to bond the upper and lower wafers together, and removing an upper portion of the upper wafer leaving a desired amount thereof.

By employing those steps above, an SOI wafer having improved gettering ability can be manufactured efficiently owing to the gettering layer of two-layer structure located above the oxide film.

Preferably, according to the invention, the bonding method follows a hydrogen implantation separation method.

By employing the arrangement above, the separated portion of the silicon substrate can be recycled and thus the cost can be decreased, as compared with the method according to which the wafer is reduced in thickness by polishing.

According to a further aspect of the invention, a method of manufacturing a semiconductor wafer employs a bonding method which so includes the steps of turning upside down an upper wafer formed of a silicon layer having an oxide film on its upper surface and overlaying the upper wafer on a lower wafer fabricated by forming a silicon layer through epitaxial growth so as to bond the upper and lower wafers together, and removing an upper portion of the silicon layer which constitutes the upper wafer leaving a desired amount thereof so as to reduce the thickness of the upper wafer.

By employing those steps, an SOI wafer having improved gettering ability can be manufactured efficiently owing to the arrangement in which the silicon layer formed through the epitaxial growth is placed below the oxide film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are herein described in conjunction with the drawings attached.

First Embodiment

Figure 1:
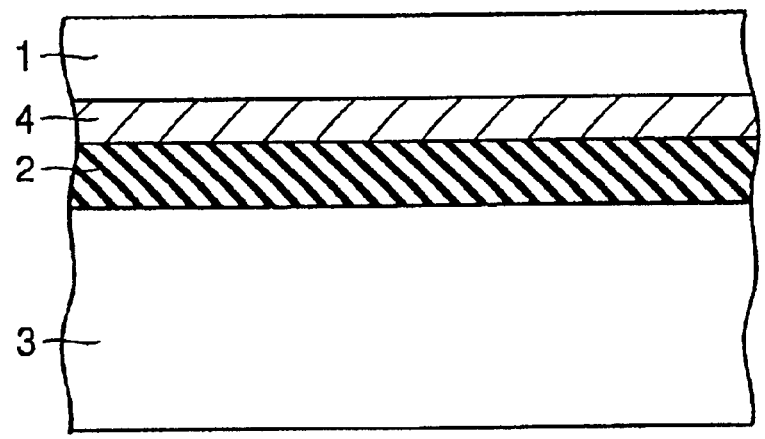
FIG. 1 illustrates a semiconductor wafer in the first embodiment according to the invention.

A semiconductor wafer according to the invention shown in FIG. 1 has an oxide film 2 on a silicon layer 3 and has a porous silicon layer 4 which is in contact with the upper side of oxide film 2. The semiconductor wafer further has a silicon layer 1 on porous silicon layer 4.

The semiconductor wafer is thus the one having an SOI structure (SOI wafer) formed of silicon layer 1 and oxide film 2, including porous silicon layer 4 within the SOI structure.

Manufacturing process steps of the semiconductor wafer in this embodiment are now described in conjunction with FIGS. 2 to 5.

Figure 2:
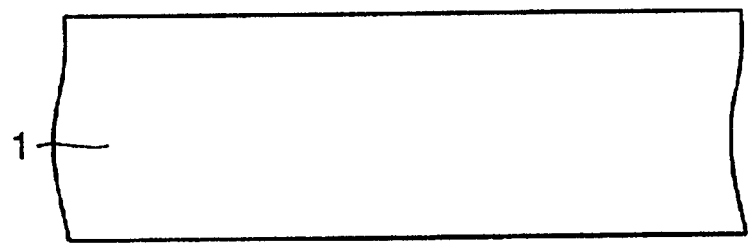
FIGS. 2 and 3 illustrate the first and second manufacturing steps respectively in the first embodiment according to the invention.
Figure 3:
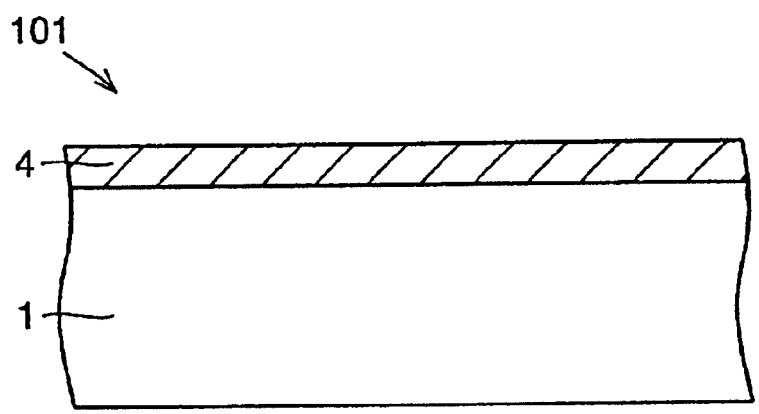

Referring to FIG. 3, on the upper surface of silicon layer 1 shown in FIG. 2, porous silicon layer 4 with a thickness of 1 $\mu$m is formed according to anodization (see "SOI Structure Fabrication Technique" by Seijiro Furukawa, Industrial Library, Oct. 23, 1987). The resultant product is referred to an upper wafer 101.

Figure 4:
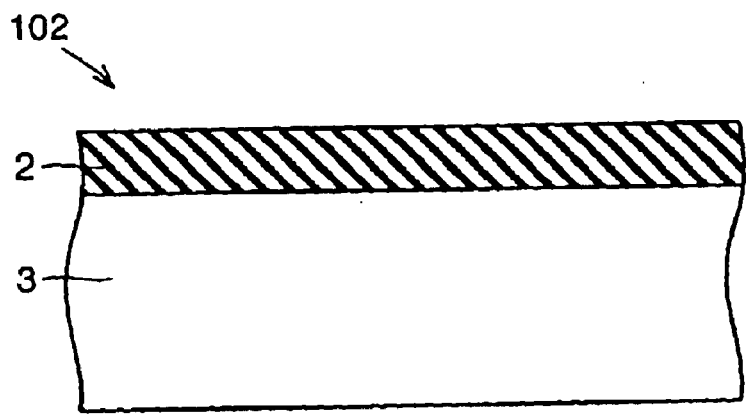
FIG. 4 illustrates a lower wafer used in the first embodiment of the invention.

Referring to FIG. 4, a lower wafer 102 is formed of silicon layer 3 and oxide film 2 on the upper surface of silicon layer 3.

Figure 5:
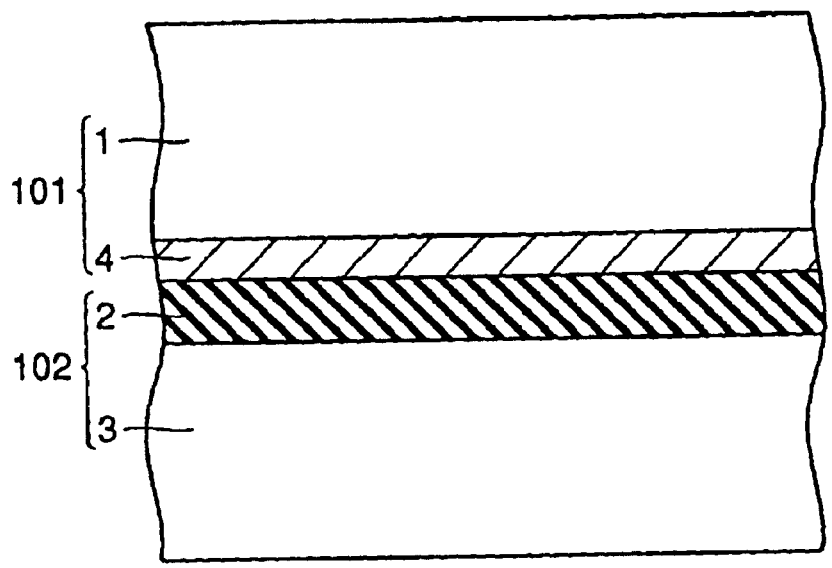
FIG. 5 illustrates the third manufacturing step in the first embodiment of the invention.

Referring to FIG. 5, upper wafer 101 is turned upside down and overlaid on lower wafer 102 to be bonded thereto. At this time the bonded upper wafer 101 and lower wafer 102 are annealed at 900° C. to 1100° C. for about 30 minutes to firmly attach upper and lower wafers 101 and 102 together. It is noted that the annealing time is not limited to 30 minutes and any time period ranging from 10 minutes to 3 hours may be employed. This time condition is applicable to all of the following embodiments.

Any unnecessary portion of silicon layer 1 which constitutes original upper wafer 101 is then polished from the upper side to make the wafer thinner.

Accordingly, the semiconductor wafer as shown in FIG. 1 is completed.

Porous silicon layer 4 has dangling bond portions corresponding to vacancies that allow gettering to be accomplished and thus serves as a gettering layer. Since porous silicon layer 4 is located above oxide film 2, gettering of impurities from silicon layer 1 located far above oxide film 2 is never interrupted by oxide film 2. Gettering ability can accordingly be enhanced in the SOI wafer where gettering has conventionally been difficult.

The gettering ability can further be enhanced by increasing the concentration of impurities that define n- or p-type of porous silicon layer 4 such as phosphorus, arsenic, antimony, boron and indium such that it ranges from $1\times10^{18}$ $cm^{-3}$ to $1\times10^{21}$ $cm^{-3}$ so as to increase solid solubility of heavy metal in this region. "High concentration" is hereinafter refers to the range from $1\times10^{18}$ $cm^{-3}$ to $1\times10^{21}$ $cm^{-3}$.

In accordance with the above-described embodiment, gettering ability is enhanced to achieve those effects such as prevention of junction leakage, enhancement of reliability of the oxide film, and improvement of the yield.

According to the invention disclosed in Japanese Patent Laying-Open No. 4-72631, a crystal defect containing layer is used instead of porous silicon layer 4 employed as a gettering layer in the present invention. Here, porous silicon layer 4 is a silicon layer formed by producing vacancies in a single crystal silicon layer. Further, a single crystal silicon can be grown on porous silicon layer 4. Therefore, porous silicon layer 4 does not correspond to the crystal defect containing layer in the document cited above. The crystal defect containing layer is changed through annealing process, and especially when it is subjected to high temperature, the crystal defect is repaired leading to deterioration in gettering ability.

On the other hand, there is basically no change in porous silicon layer 4 when it is subjected to annealing process. In view of this, the semiconductor wafer according to the present invention is superior in gettering ability than the semiconductor wafer according to the invention disclosed in the document above in which the crystal defect containing layer is used as a gettering layer.

Second Embodiment

A semiconductor wafer in this embodiment shown in FIG. 6 includes an oxide film 2 located above silicon layer 3 and a porous silicon layer 4 located on oxide film 2 via a silicon layer 5 produced through epitaxial growth (hereinafter referred to as "epitaxial silicon layer"). The semiconductor wafer further includes a silicon layer 1 on porous silicon layer 4.

The semiconductor wafer is thus an SOI wafer having the SOI structure constituted of silicon layer 1 and oxide film 2. In the SOI layer, porous silicon layer 4 is provided.

Figure 7:
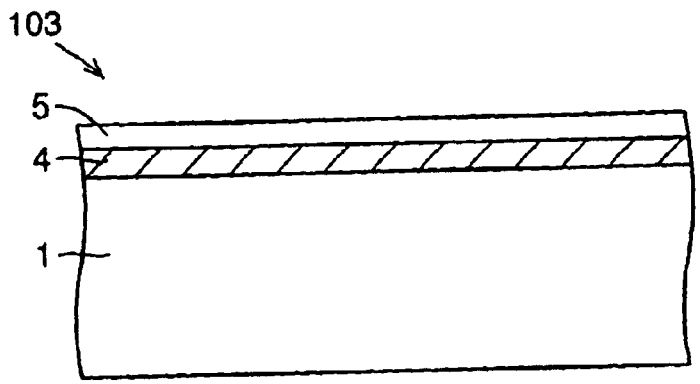
FIG. 7 illustrates the second manufacturing step in the second embodiment of the invention.
Figure 8:
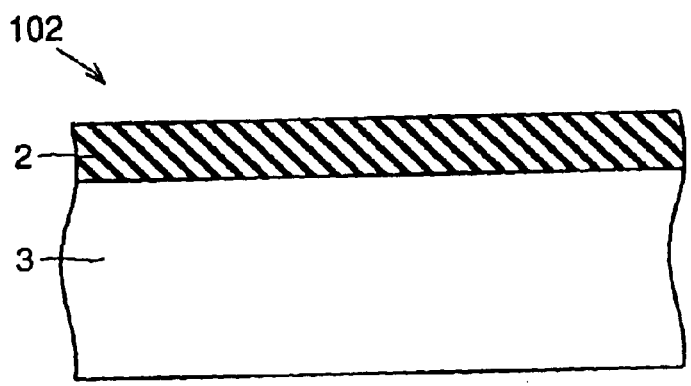
FIG. 8 illustrates a lower wafer used in the second embodiment of the invention.
Figure 9:
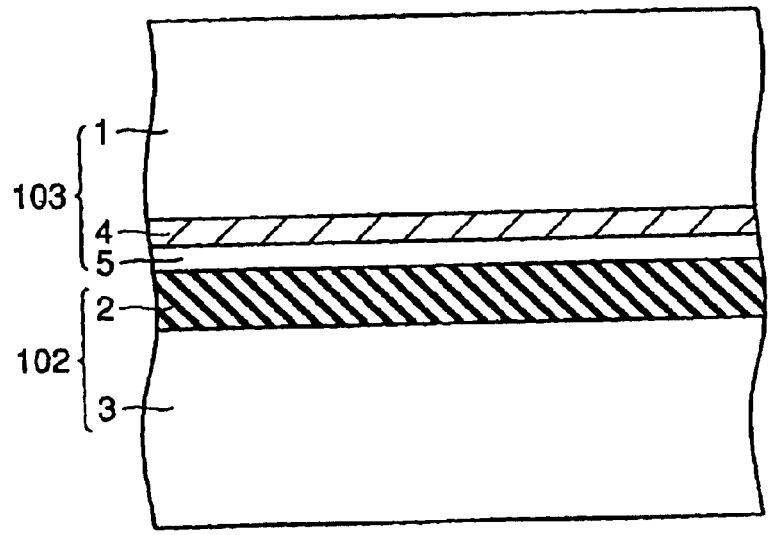
FIG. 9 illustrates the third manufacturing step in the second embodiment of the invention.

Manufacturing process steps of the semiconductor wafer in this embodiment are now described in conjunction with FIGS. 7 to 9.

Referring to FIG. 7, porous silicon layer 4 is formed through anodization on the upper surface of silicon layer 1 as shown in FIG. 2. Silicon layer 5 is further formed on the upper surface of porous silicon layer 4 through epitaxial growth at 700 to 900° C. The resultant product is referred to as an upper wafer 103.

Referring to FIG. 8, a lower wafer 102 includes silicon layer 3 and oxide film 2 on the upper surface thereof. Referring to FIG. 9, upper wafer 103 is turned upside down and is overlaid on lower wafer 102 to bond them together. At this time, upper wafer 103 and lower wafer 102 are annealed at 900 to 1100° C. for about 30 minutes to firmly bond upper and lower wafers 103 and 102. After that, any unnecessary portion of silicon layer 1 which originally constitutes upper wafer 103 is removed by polishing applied to the upper side.

Figure 6:
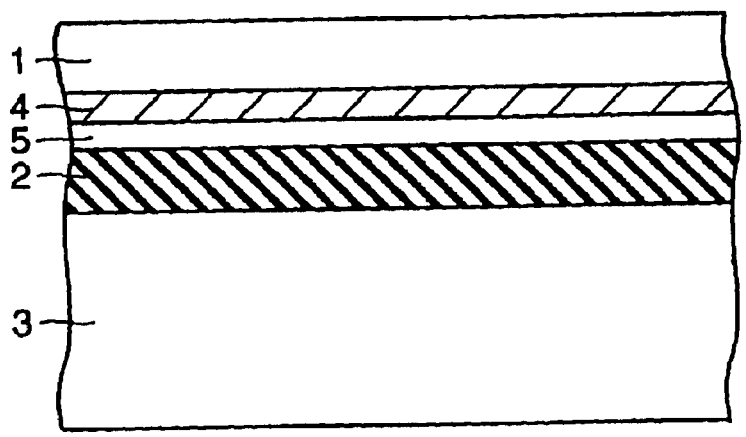
FIG. 6 illustrates a semiconductor wafer in the second embodiment of the invention.

In this way, the semiconductor wafer of the present invention as shown in FIG. 6 is completed.

In the structure described above, porous silicon layer 4 serves as a gettering layer, and gettering is not interrupted by oxide film 2 since porous silicon layer 4 is located above oxide film 2. Therefore, improvement of gettering ability is achieved in the SOI wafer where gettering has conventionally been difficult.

Bonding strength between oxide film 2 and the SOI layer located above can further be improved by placing silicon layer 5 between porous silicon layer 4 and oxide film 2, compared with the structure in the first embodiment.

Third Embodiment

In this embodiment, another method of manufacturing the semiconductor wafer according to the first embodiment as shown in FIG. 1 is described.

Manufacturing process steps of a semiconductor wafer in this embodiment are hereinafter described in conjunction with FIGS. 10 to 17.

Figure 10:
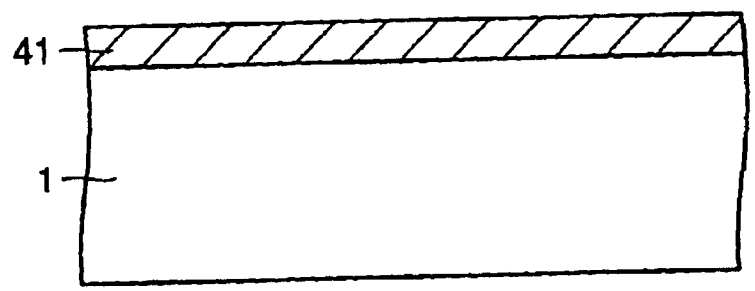
FIGS. 10 to 13 respectively illustrate the second to the fifth manufacturing steps in the third embodiment of the invention.

Referring to FIG. 10, anodization is employed to form a first porous silicon layer 41 with a thickness of 1 μm on the upper surface of silicon layer 1 which is similar to the one shown in FIG. 2.

Figure 11:
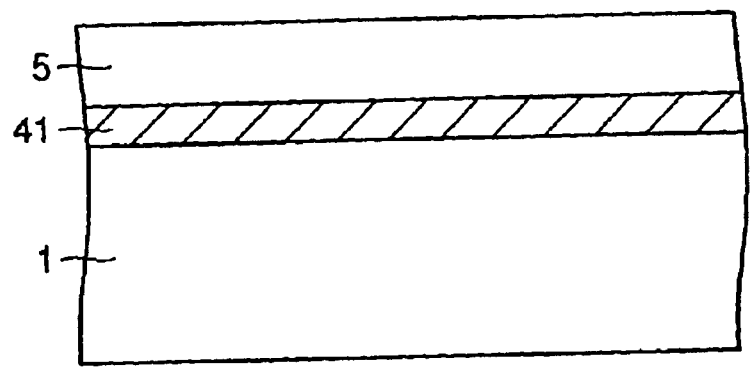

Referring to FIG. 11, an epitaxial silicon layer 5 is formed through epitaxial growth at 700 to 900° C. on the upper surface of the first porous silicon layer 41.

Figure 12:
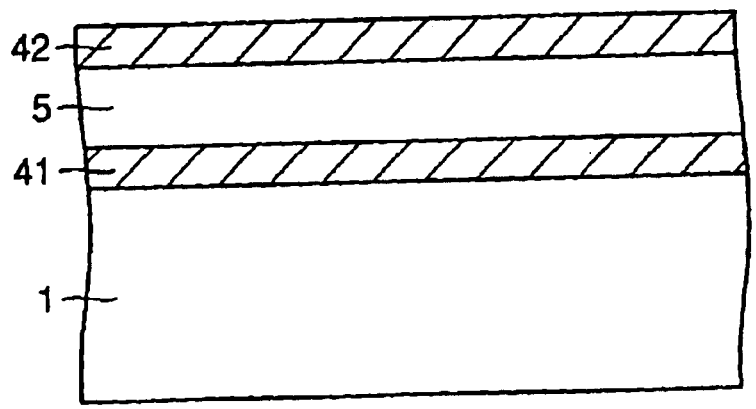

Referring to FIG. 12, a second porous silicon layer 42 is further formed on epitaxial silicon layer 5 by anodization. At this time, density of vacancies in the second porous silicon layer 42 is made lower than that in the first porous silicon layer 41.

Figure 13:
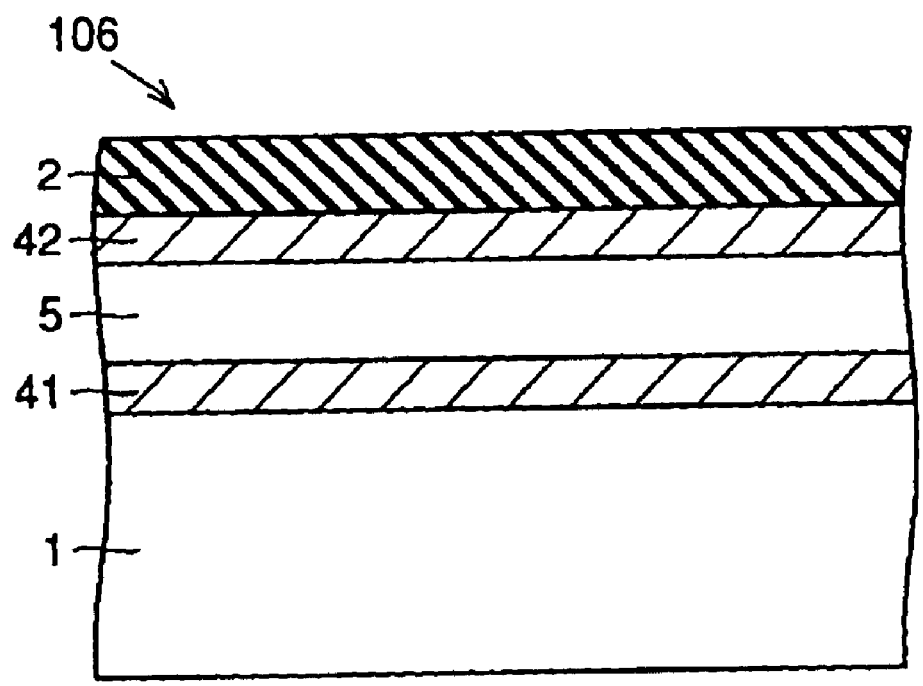

Referring to FIG. 13, an oxide film 2 is formed on the upper surface of the second porous silicon layer 42 and thus an upper wafer 106 is produced.

Figure 14:
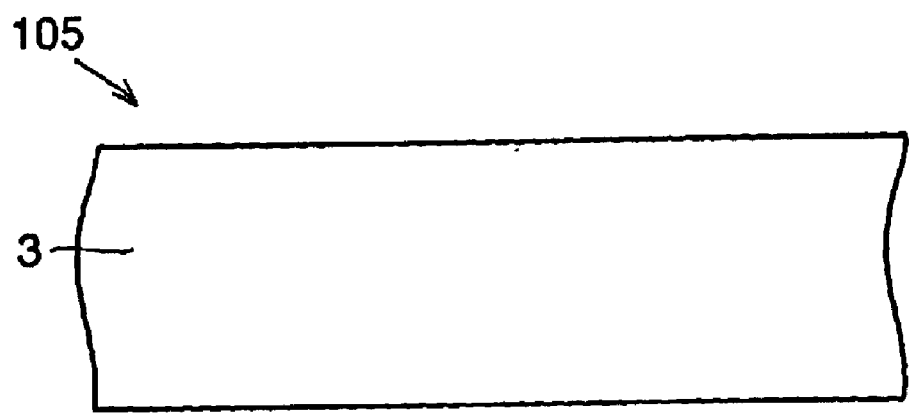
FIG. 14 illustrates a lower wafer used in the third embodiment of the invention.
Figure 15:
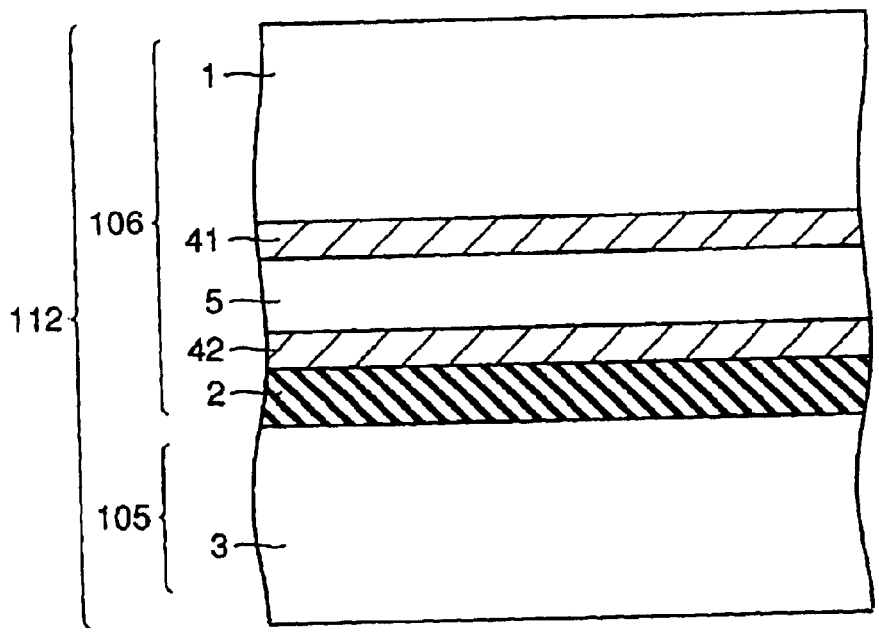
FIGS. 15 to 17 respectively illustrate the sixth to the eighth manufacturing steps in the third embodiment of the invention.

Referring to FIG. 15, upper wafer 106 is turned upside down and overlaid on a lower wafer 105 as shown in FIG. 14 formed of a silicon layer to bond upper and lower wafers together. At this time, upper and lower wafers 106 and 105 are annealed at 900 to 1100° C. for about 30 minutes to reinforce the bonding of upper and lower wafers 106 and 105. Accordingly, upper and lower wafers 106 and 105 are bonded together to produce a semiconductor wafer 112.

Figure 16:
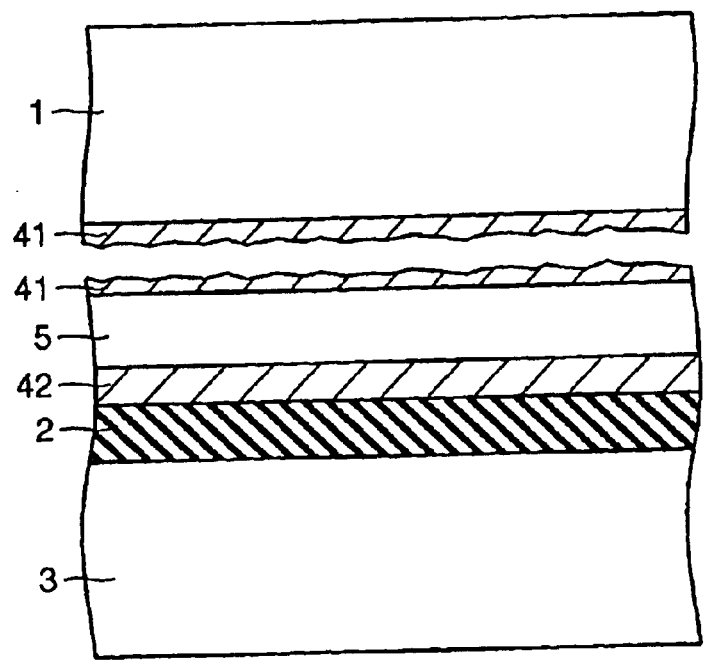

Referring to FIG. 16, semiconductor wafer 112 is separated at the first porous silicon layer 41. The density of vacancies in the first silicon layer 41 is higher than that in the second porous silicon layer 42 as explained above, and separation thus easily occurs at this layer.

Figure 17:
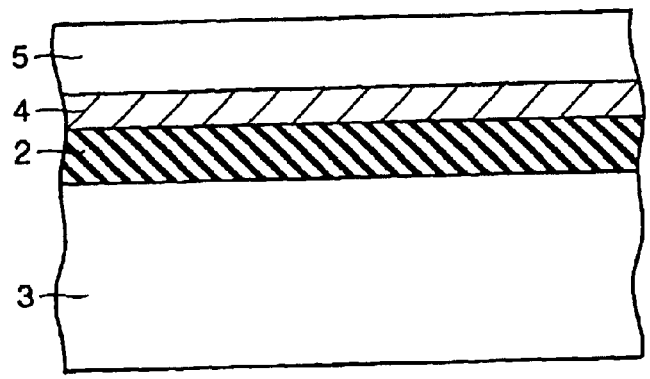

The portion of the first porous silicon layer 41 left on the surface of the lower section of the separated wafer is etched away. Hydrogen annealing at 1000 to 1300° C. is applied to semiconductor wafer 112, and consequently, epitaxial silicon layer 5 forms the uppermost surface as shown in FIG. 17.

In this way, the semiconductor wafer of the present invention as shown in FIG. 1 is completed. The function end effect of the completed semiconductor wafer are similar to those described in conjunction with the first embodiment.

Fourth Embodiment

Another method of manufacturing the semiconductor wafer according to the second embodiment illustrated in FIG. 6 is described below according to the fourth embodiment.

Process steps of manufacturing a semiconductor wafer in this embodiment are hereinafter described in conjunction with FIGS. 10 to 12 and FIGS. 18 and 19.

The manufacturing process steps as illustrated in FIGS. 10 to 12 are also employed in this embodiment. For convenience of explanation, epitaxial silicon layer 5 shown in FIGS. 11 and 12 is referred to as a first epitaxial silicon layer 51 in this embodiment.

Figure 18:
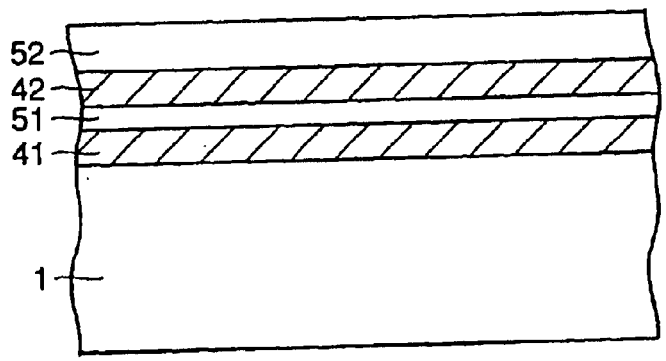
FIGS. 18 and 19 respectively illustrate the fifth and sixth manufacturing steps in the fourth embodiment of the invention.
Figure 19:
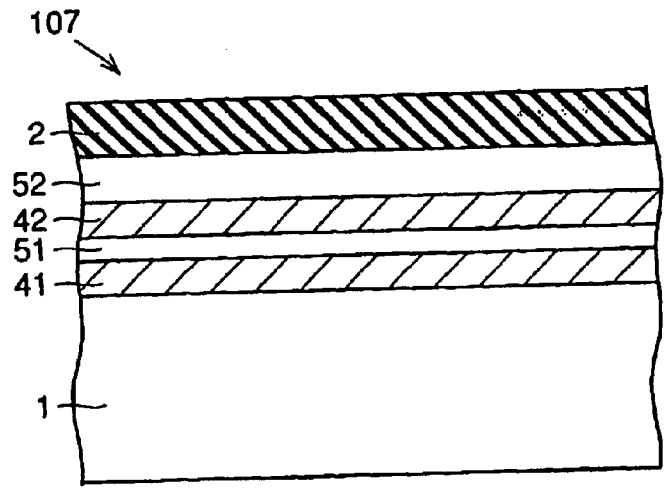

Referring to FIG. 18, an epitaxial silicon layer 52 is formed through epitaxial growth at 700 to 900° C. on the semiconductor wafer as shown in FIG. 12. Referring to FIG. 19, an oxide film 2 is deposited on the surface of epitaxial silicon layer 52 and accordingly an upper wafer 107 is completed.

Upper wafer 107 is turned upside down and overlaid on a lower wafer 105 formed of a silicon layer as shown in FIG. 14 to bond upper and lower wafers 107 and 105 together (not shown). At this time, bonding of upper and lower wafers 107 and 105 is reinforced by annealing them at 900 to 1100° C. for about 30 minutes. Subsequent steps are similar to those of the third embodiment as shown in FIGS. 16 and 17.

Finally, a semiconductor wafer having the same structure as that of the second embodiment as shown in FIG. 6 is completed. The structure, function and effect of the completed semiconductor wafer are similar to those discussed in conjunction with the second embodiment.

Fifth Embodiment

Figure 20:
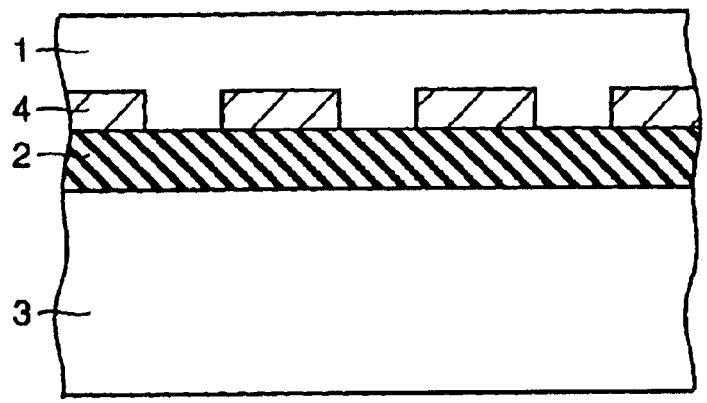
FIG. 20 illustrates a semiconductor wafer in the fifth embodiment of the invention.

A semiconductor wafer of the present invention shown in FIG. 20 includes an oxide film 2 on a silicon layer 3 and a porous silicon layer 4 which is in contact with the upper side of oxide film 2 and placed in any selected region. Further, the semiconductor wafer includes a silicon layer 1 on porous silicon layer 4.

According to this embodiment, the semiconductor wafer having porous silicon layer 4 placed in any selected region is described together with a manufacturing method thereof in conjunction with FIGS. 21 to 24.

Figure 21:
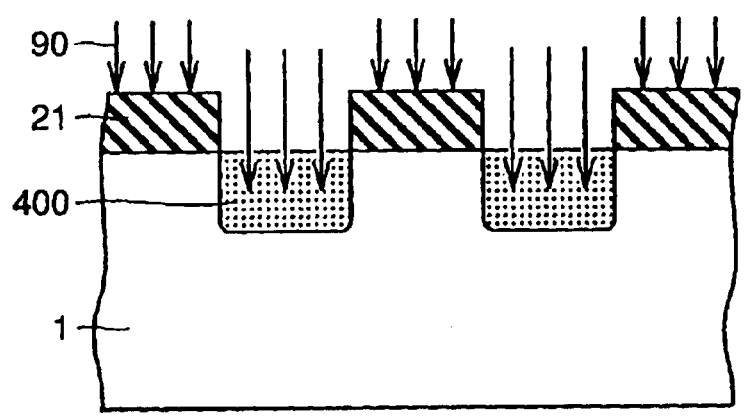
FIGS. 21 to 24 illustrate the second to the fifth manufacturing steps respectively in the fifth embodiment of the invention.

Referring to FIG. 21, on a semiconductor wafer formed of a silicon layer 1 similar to that shown in FIG. 2, an oxide film is formed to be patterned and thus an oxide mask 21 is produced. Oxide mask 21 serves as a mask used when hydrogen ions are implanted. The mask may alternatively be made of resist or $Si_3N_4/SiO_2$.

Using oxide mask 21, hydrogen is implanted into silicon layer 1 under the conditions of 10 to 80 keV and $1\times10^{14}$ to $1\times10^{16}$ cm$^{-2}$. Implantation of hydrogen ions generates donors of an n-type layer 400 in silicon. A p-type layer is formed under oxide mask 21.

Figure 22:
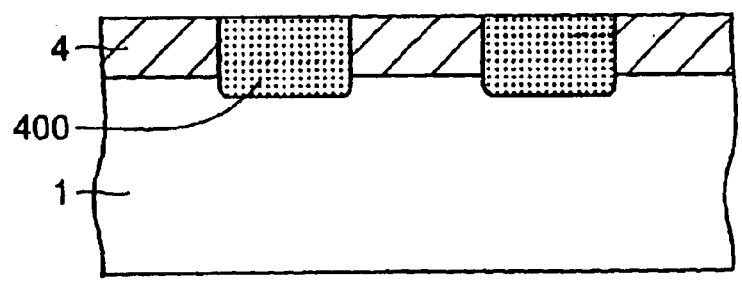

Referring to FIG. 22, oxide mask 21 is removed by HF (Hydrogen Fluoride) liquid and anodization is carried out to selectively make porous the p-type layer. Through this step, porous silicon layer 4 is formed.

Figure 23:
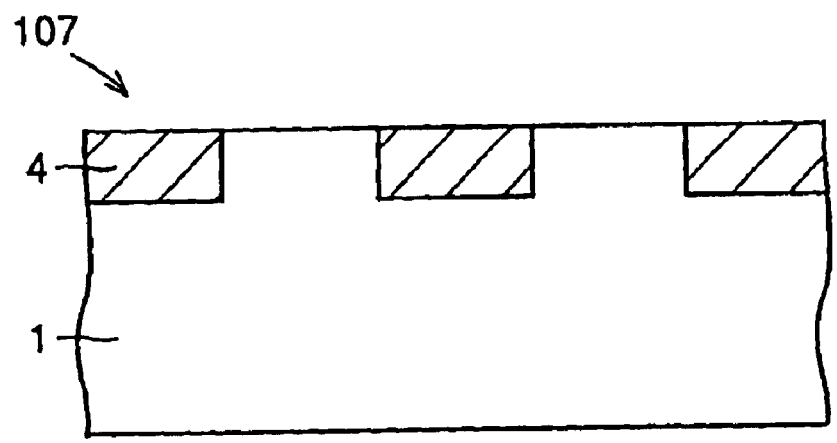

The resultant semiconductor wafer is annealed at 700° C. or higher, and thus n-type layer 400 disappears as shown in FIG. 23. The wafer shown in FIG. 23 is referred to as an upper wafer 107.

Figure 24:
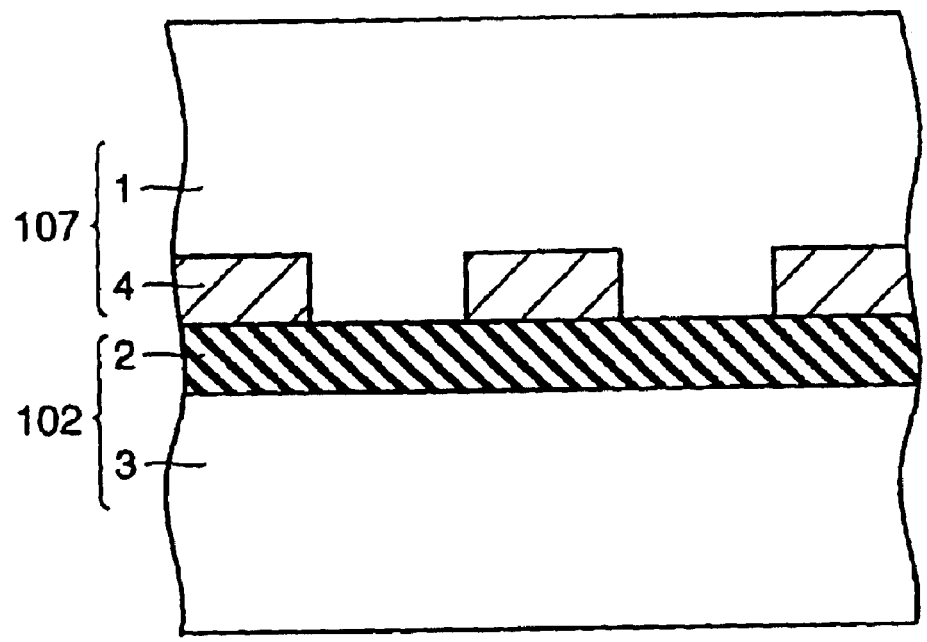

Referring to FIG. 24, upper wafer 107 is turned upside down and laid over a lower wafer 102 similar to that shown in FIG. 4 to bond them together, and the bonded upper and lower wafers 107 and 102 are annealed at 900 to 1100° for about 30 minutes to reinforce the bonding between upper and lower wafers 107 and 102.

The wafer is then reduced in thickness by polishing the upper side of any unnecessary portion of silicon layer 1 which originally constitutes upper wafer 107. The semiconductor wafer as shown in FIG. 20 is accordingly completed.

Sixth Embodiment

Figure 25:
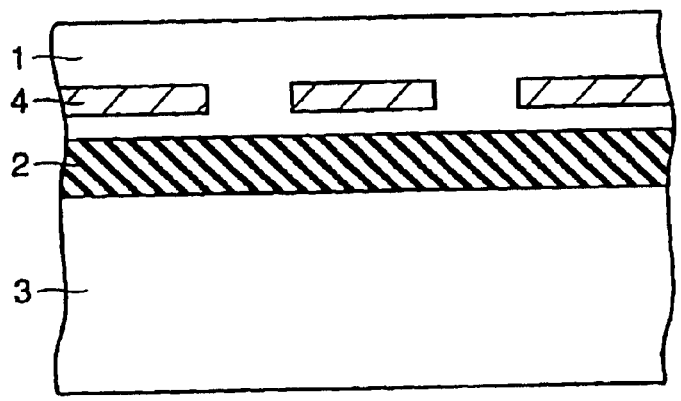
FIG. 25 illustrates a semiconductor wafer in the sixth embodiment of the invention.

A semiconductor wafer shown in FIG. 25 according to the invention has an oxide film 2 which is in contact with the upper side of a silicon layer 3, and a porous silicon layer 4 placed in a selected region and located above oxide film 2 via a silicon layer 1. The semiconductor wafer further has a silicon layer 1 on the upper side of porous silicon layer 4.

Following the manufacturing process steps in Modification 1, the step of generating the porous layer and the step of removing the n-type layer respectively shown in FIGS. 22 and 23 are performed, and then silicon layer 1 is formed by epitaxial growth over the entire upper surface. Consequently, the semiconductor wafer of the present invention as illustrated in FIG. 25 can similarly be fabricated.

Figure 26:
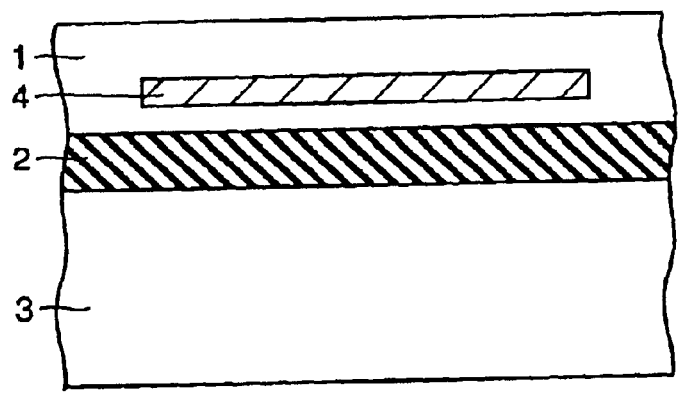
FIG. 26 illustrates another modification of the semiconductor wafer in the sixth embodiment of the invention.

A semiconductor wafer as shown in FIG. 26 in accordance with the present invention can be manufactured by changing the region where the layer is made porous.

In the manufacturing steps explained in conjunction with other embodiments, porous silicon layer 4 can be formed in any selected region only by a method similar to that described in conjunction with this embodiment.

Figure 27:
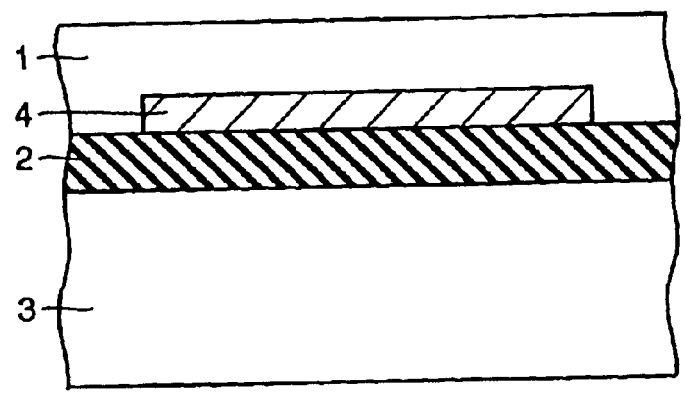
FIG. 27 illustrates a further modification of the semiconductor wafer in the sixth embodiment of the invention.
Figure 28:
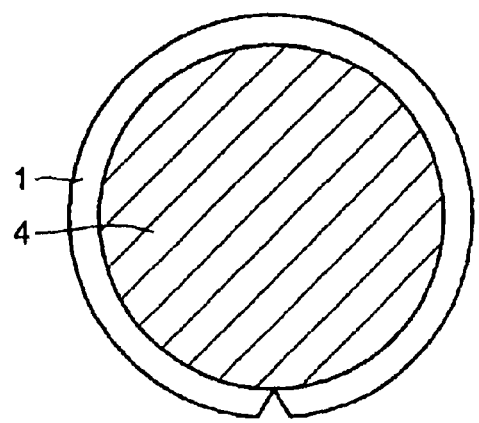
FIG. 28 is a plan view of the semiconductor wafer in the sixth embodiment of the invention.

If the semiconductor wafer of the invention shown in FIG. 20 is employed, arrangement of the selected region may be the one shown in FIG. 27 instead of that shown in FIG. 20. For example, as illustrated in the plan view in FIG. 28, porous silicon layer 4 may be placed only in the central portion without forming porous silicon layer 4 on the edge of the semiconductor wafer.

If the entire interface to be bonded is the one between porous silicon layer 4 and oxide film 2, the bonding strength could be insufficient. According to the manufacturing process in the fifth and sixth embodiments, at the interface where bonding occurs, not only porous silicon layer 4 but a surface constituted of silicon layer 1 and porous silicon layer 4 is opposed to oxide film 2. Therefore, the satisfactory bonding strength is ensured.

Porous silicon layer 4 is provided in any selected region and functions as a gettering layer, and accordingly an SOI wafer having a superior gettering ability is achieved.

It is noted that if impurities such as phosphorous, arsenic, antimony, boron and indium which define n- or p-type of porous silicon layer 4 placed in a selected region are increased in concentration ranging from $1\times10^{18}$ cm$^{-3}$ to $1\times10^{21}$ cm$^{-3}$, the solid solubility of heavy metal in this region increases to enhance gettering ability.

According to the fifth and sixth embodiments described above, the gettering ability is enhanced and consequently those effects can be accomplished such as prevention of junction leakage, enhancement of reliability of the oxide film and improvement of yield as accomplished by the first embodiment.

Seventh Embodiment

A semiconductor device of the present invention according to this embodiment is hereinafter described in conjunction with FIGS. 29 to 31.

Structure of Semiconductor Wafer

Figure 29:
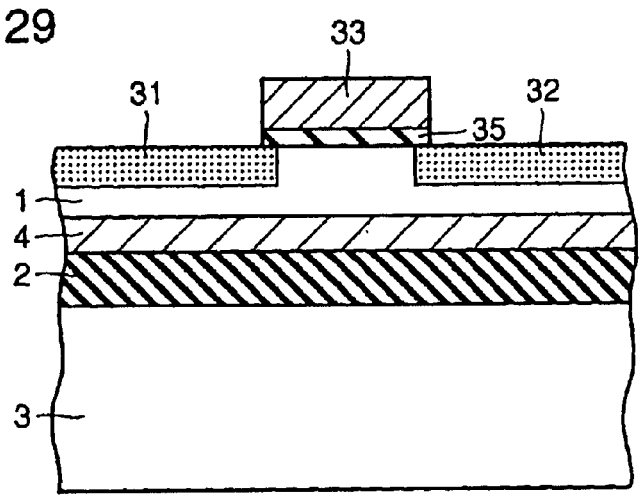
FIG. 29 illustrates a semiconductor device in the seventh embodiment of the invention in which a depletion layer is not in contact with the interface between a silicon layer and a porous silicon layer.
Figure 30:
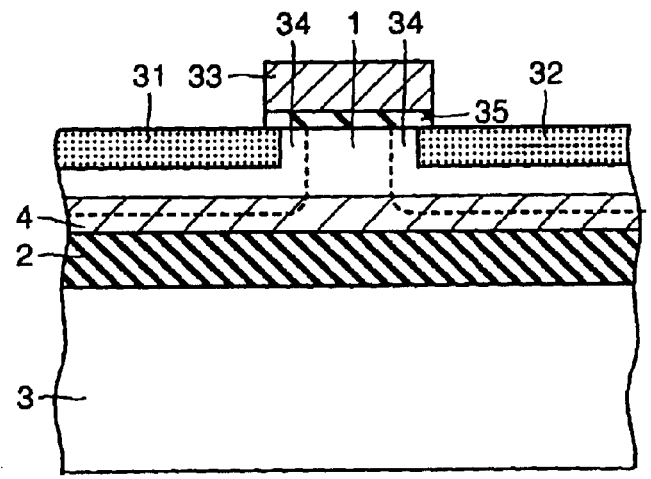
FIG. 30 illustrates the semiconductor device in the seventh embodiment of the invention in which the depletion layer reaches the interface between the silicon layer and the porous silicon layer.

Referring to FIGS. 29 and 30, an MOS (Metal Oxide Semiconductor) transistor is constructed on a silicon layer 1 of a semiconductor wafer as employed in the first embodiment shown in FIG. 1.

In FIG. 29, silicon layer 1 in the SOI structure is sufficiently thick so that a depletion layer 34 in a source region 31 and a drain region 32 does not reach the interface between silicon layer 1 and a porous silicon layer 4.

On the other hand, in FIG. 30, depletion layer 34 of source region 31 and drain region 32 reaches the region of porous silicon layer 4.

In the structure as shown in FIG. 29, increase in junction leakage can be prevented since porous silicon layer 4 is not in contact with depletion layer 34 of source and drain regions 31 and 32. The structure of the MOS transistor is effective for the power device in which the SOI structure is especially thick.

Figure 31:
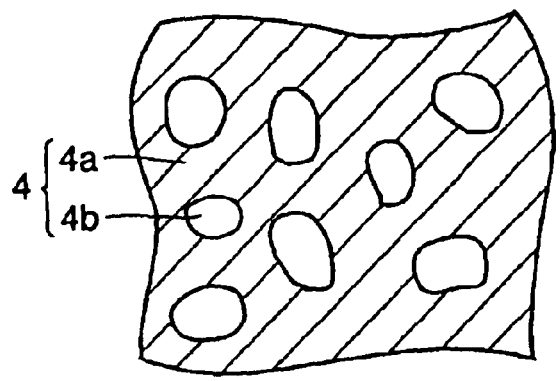
FIG. 31 is an enlarged view partially illustrating a porous silicon layer of a semiconductor wafer according to the invention.

Porous silicon layer 4 in the structure shown in FIG. 30 is partially illustrated in FIG. 31 to an enlarged scale. Porous silicon layer 4 includes not only a region 4a with a relative dielectric constant of 11.9 but a region 4b with a relative dielectric constant of 1 corresponding to a vacancy, so that junction capacitance of source and drain regions 31 and 32 can be reduced. If depletion layer 34 of source and drain regions 31 and 32 is in contact with oxide film 2, the junction capacitance of source and drain regions 31 and 32 can be reduced.

Instead of the depletion layer mentioned above, if junction of source region 31 and drain region 32 is directly in contact with the oxide film, the junction capacitance is apparently decreased.

Eighth Embodiment

Figure 32:
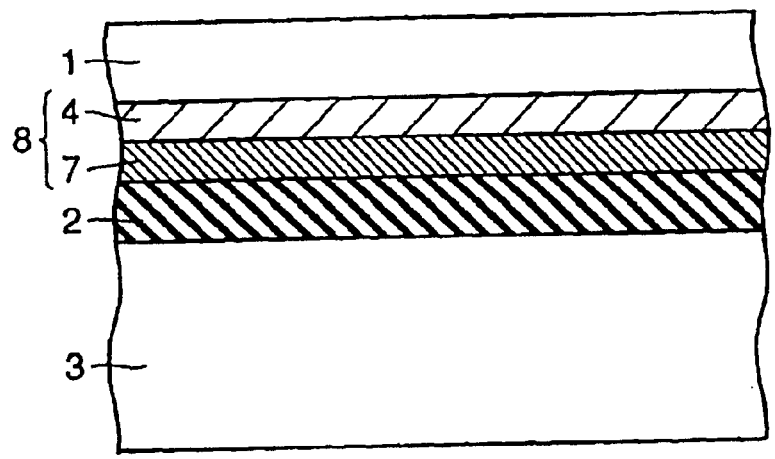
FIG. 32 illustrates a semiconductor wafer in the eighth embodiment of the invention.

A semiconductor wafer in this embodiment shown in FIG. 32 has an oxide film 2 on a silicon layer 3 and a second gettering layer 7 which is in contact with the upper side of oxide film 2. Second gettering layer 7 is formed of a polycrystalline silicon layer having an impurity region or formed of a crystal defect containing layer. On the second gettering layer, a porous silicon layer 4 is placed in contact with the upper side thereof, and a silicon layer 1 is further placed on porous silicon layer 4.

The semiconductor wafer is thus the SOI wafer having the SOI structure constituted of silicon layer 1 and oxide film 2. A gettering layer of two-layer structure 8 formed of porous silicon layer 4 and the second gettering layer 7 is provided within the SOI structure.

Although porous silicon layer 4 is positioned on the second gettering layer 7 constituted of a polycrystalline silicon layer having an impurity region or formed of a crystal defect containing layer in the two-layer structure 8, the positional relation may be reversed.

Manufacturing process steps of the semiconductor wafer in this embodiment are now described in conjunction with FIGS. 2, 4, 33 and 34.

Figure 33:
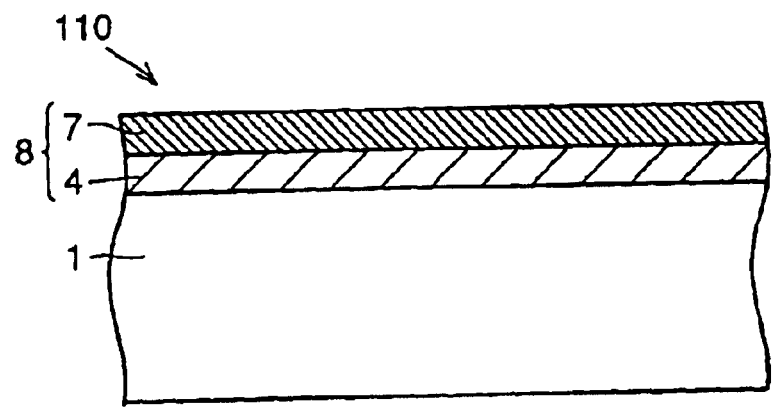
FIGS. 33 and 34 respectively illustrate the second and third manufacturing steps in the eighth embodiment of the invention.

Referring to FIG. 33, anodization is utilized to produce porous silicon layer 4 with a thickness of 1 μm on the upper surface of silicon layer 1 similar to that shown in FIG. 2, and a polycrystalline silicon layer having an impurity region or a crystal defect containing layer is formed on the upper surface of porous silicon layer 4 as the second gettering layer 7. The resultant wafer is referred to as an upper wafer 110.

Figure 34:
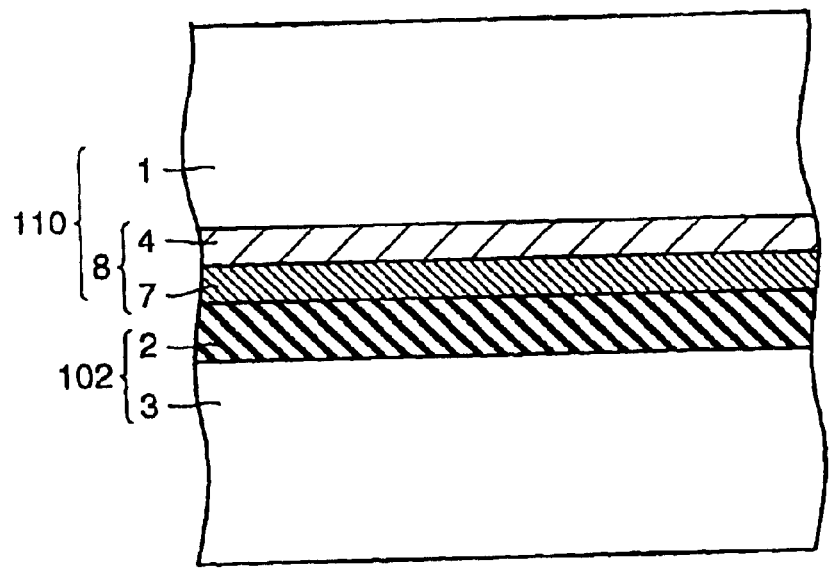

Referring to FIG. 34, upper wafer 110 is reversed and overlaid on a lower wafer 102 which is similar to that shown in FIG. 4 to bond them together. At this time, an annealing process is conducted at 900 to 1100° C. for about 30 minutes to reinforce bonding between upper wafer 110 and lower wafer 102. Any unnecessary portion of silicon layer 1 which originally constitutes upper wafer 110 is removed by polishing the upper side thereof so as to decrease the thickness of the wafer.

The semiconductor wafer as shown in FIG. 32 is thus completed.

The semiconductor wafer is thus constructed such that the gettering layer located above oxide film 2 has two-layer structure 8 to implement an SOI wafer with gettering ability improved as compared with a wafer having a gettering layer formed of only one layer.

According to the invention disclosed in Japanese Patent Laying-Open No. 8-116038, a polycrystalline silicon layer 14 with highly doped phosphorus is employed instead of porous silicon layer 4 of the present invention. Even if the polycrystalline silicon layer is highly doped with phosphorus at first, the subsequent annealing process for producing any semiconductor device causes the crystal structure of the polycrystalline silicon layer to change, possibly leading to deterioration of gettering ability of the polycrystalline silicon layer. On the other hand, according to this embodiment, gettering ability is further enhanced by providing two-layer structure 8 formed of the polycrystalline silicon layer and porous silicon layer 4 having its gettering ability unchanged basically through annealing.

Ninth Embodiment

Figure 35:
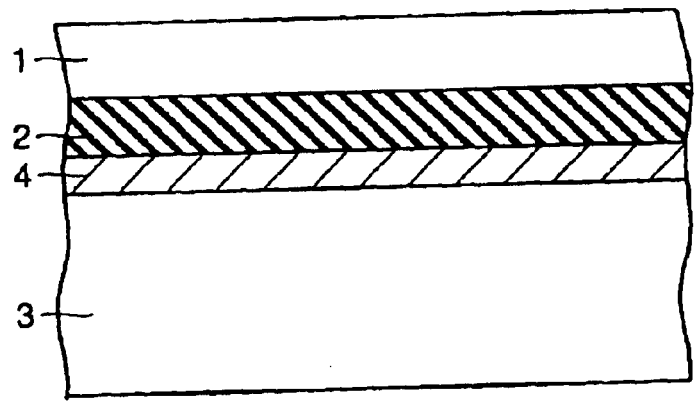
FIG. 35 illustrates a semiconductor wafer in the ninth embodiment of the invention.

A semiconductor wafer in this embodiment shown in FIG. 35 has an oxide film 2 on a silicon layer 3 via a porous silicon layer 4, and a silicon layer 1 which contacts the upper side of oxide film 2.

The semiconductor wafer is thus an SOI wafer having the SOI structure formed of silicon layer 1 and oxide film 2. Porous silicon layer 4 is provided which is in contact with the lower side of the SOI structure.

Manufacturing process steps of the semiconductor wafer in this embodiment are now described in conjunction with FIGS. 36 to 39.

Figure 36:
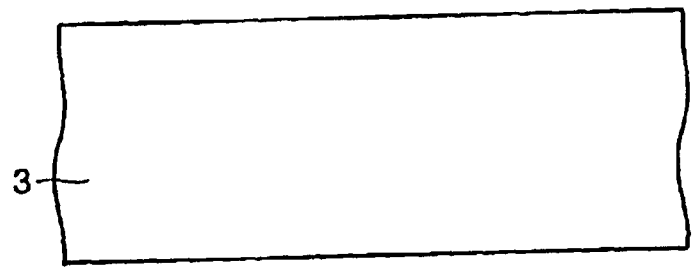
FIGS. 36 and 37 respectively illustrate the first and second manufacturing steps in the ninth embodiment of the invention.
Figure 37:
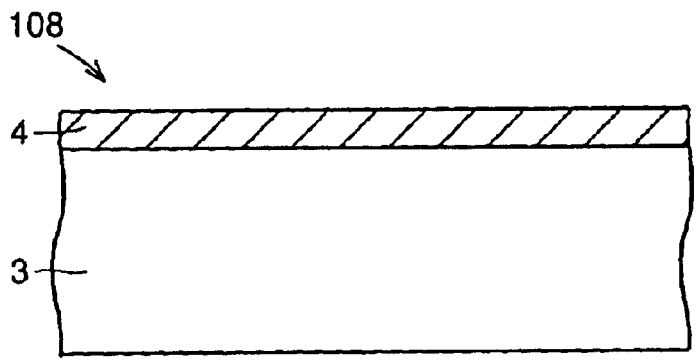

Referring to FIG. 37, porous silicon layer 4 with a thickness of 1 μm is formed through anodization on the upper surface of silicon layer 3 as shown in FIG. 36 to produce a lower wafer 108.

Figure 38:
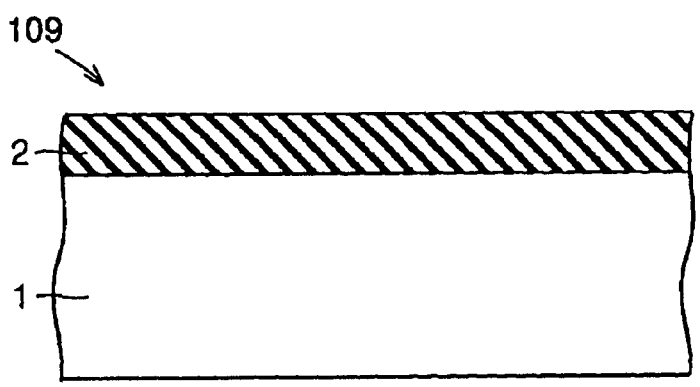
FIG. 38 illustrates an upper wafer used in the ninth embodiment of the invention.
Figure 39:
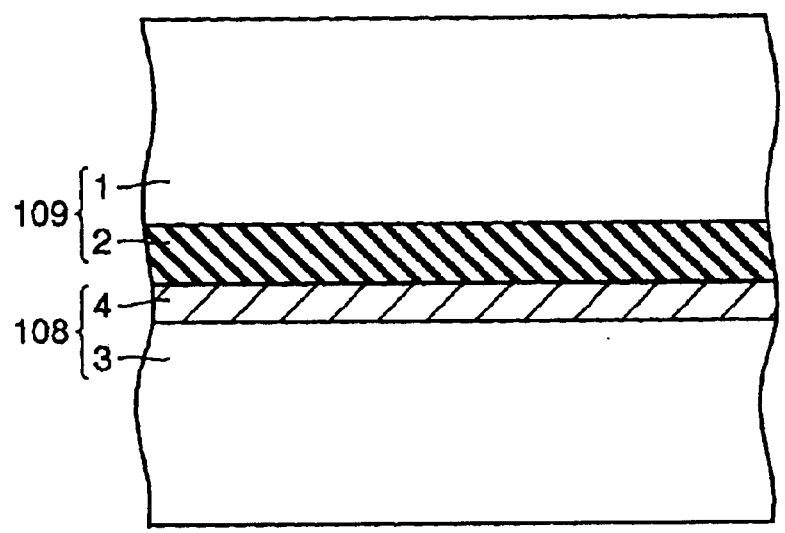
FIG. 39 illustrates the third manufacturing step in the ninth embodiment of the invention.

Referring to FIG. 38, an upper wafer 109 is constituted of silicon layer 1 and oxide film 2 formed on the upper surface thereof. Referring to FIG. 39, upper wafer 109 is turned upside down and overlaid on lower wafer 108 to bond them together. At this time, annealing is performed at 900 to 1100° C. for about 30 minutes so as to reinforce bonding. After that, any unnecessary portion of silicon layer 1 which originally constitutes upper wafer 109 is removed by polishing the upper side thereof to reduce the thickness of the wafer. The semiconductor in this embodiment according to the present invention is accordingly completed as shown in FIG. 35.

Gettering ability can be exhibited relative to heavy metal which is diffused in an SOI wafer having thin oxide film 2 since porous silicon layer 4 placed under oxide film 2 selves as a gettering layer. Gettering ability is thus improved in the SOI wafer.

Figure 40:
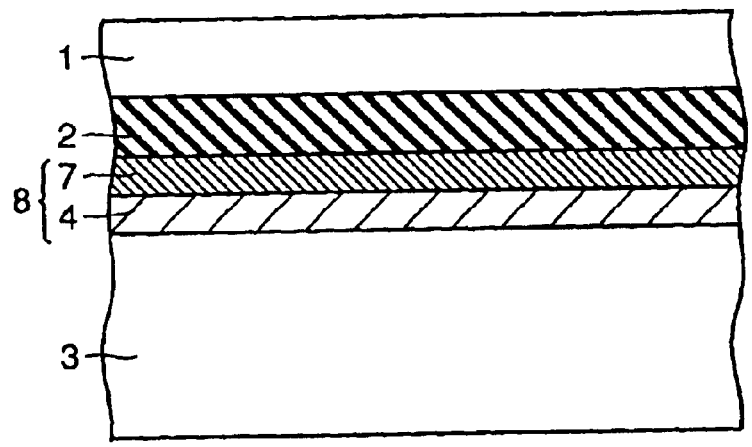
FIGS. 40 and 41 illustrate the first and second examples of a semiconductor wafer having a two-layer structure in the ninth embodiment of the invention.
Figure 41:
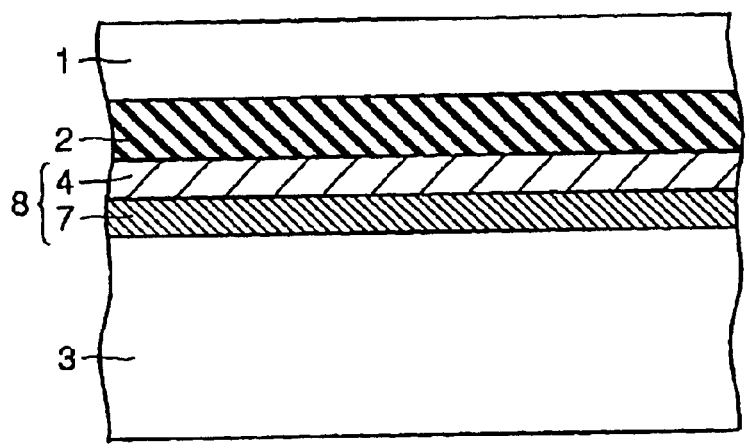

The gettering ability can further be improved if a gettering layer having two-layer structure 8 as shown in FIG. 32 according to the eighth embodiment is used, instead of porous silicon layer 4, such that the gettering layer is in contact with the lower side of oxide film 2, as shown in FIGS. 40 and 41.

The effect of this structure is further enhanced when any structure according to the first, second, fifth, sixth, seventh or eighth embodiment is employed in combination with it and gettering layers are placed on both of the upper and lower sides of oxide film 2 respectively, compared with the sole structure of the ninth embodiment.

Tenth Embodiment

A method of manufacturing the semiconductor of the invention as shown in FIG. 1 is now described, according to this embodiment employing hydrogen implantation separation method, in conjunction with FIGS. 42 to 47.

Figure 42:
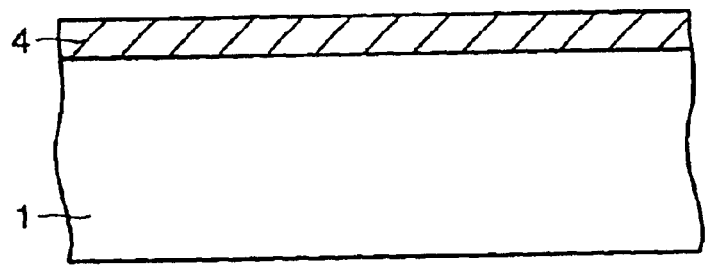
FIGS. 42 to 44 illustrate respectively the second to the fourth manufacturing steps in the tenth embodiment of the invention.

Referring to FIG. 42, a porous silicon layer 4 with a thickness of 1 μm is formed through anodization on the upper surface of a silicon layer 1 similar to that shown in FIG. 2.

Figure 43:
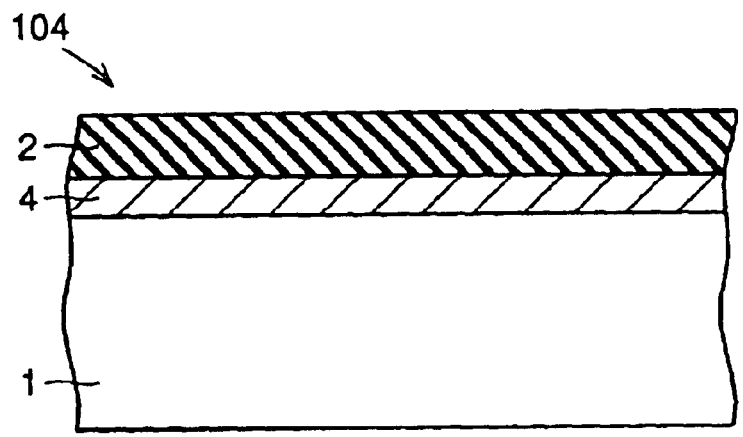

Referring to FIG. 43, an oxide film 2 is formed to a thickness of 4000 Å through thermal oxidation on the upper surface of porous silicon layer 4 to produce an upper wafer 104. Oxide film 2 may be formed by CVD (Chemical Vapor Deposition).

Figure 44:
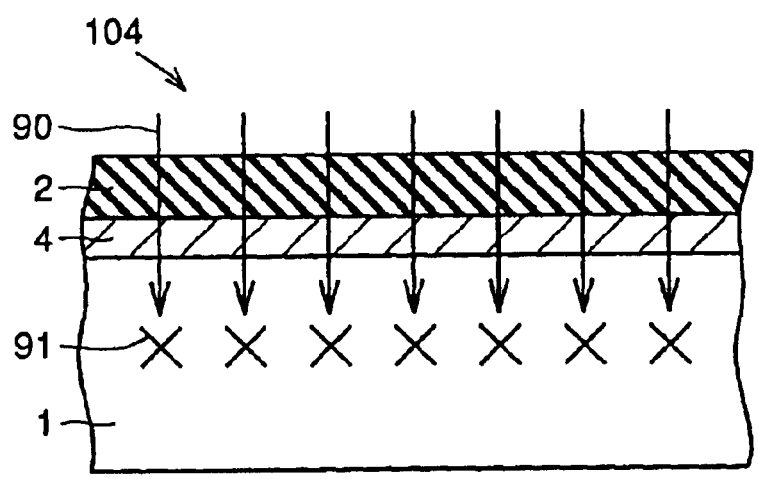

Referring to FIG. 44, hydrogen ions are implanted in the direction of the arrow 90. If the thickness of oxide film 2 is 4000 Å and the thickness of porous silicon layer 4 is 1 μm, the conditions of hydrogen ion implantation are 190 keV and $1 \times 10^{16}$ to $1 \times 10^{17}$ cm$^{-2}$. Consequently a layer containing defect 91 is produced below porous silicon layer 4 as shown in FIG. 44.

Figure 45:
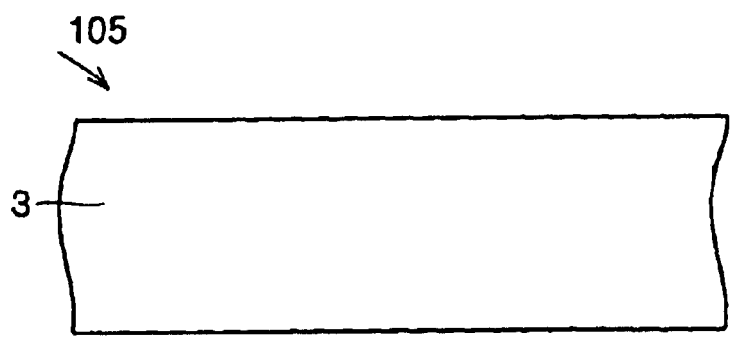
FIG. 45 illustrates a lower wafer used in the tenth embodiment of the invention.
Figure 46:
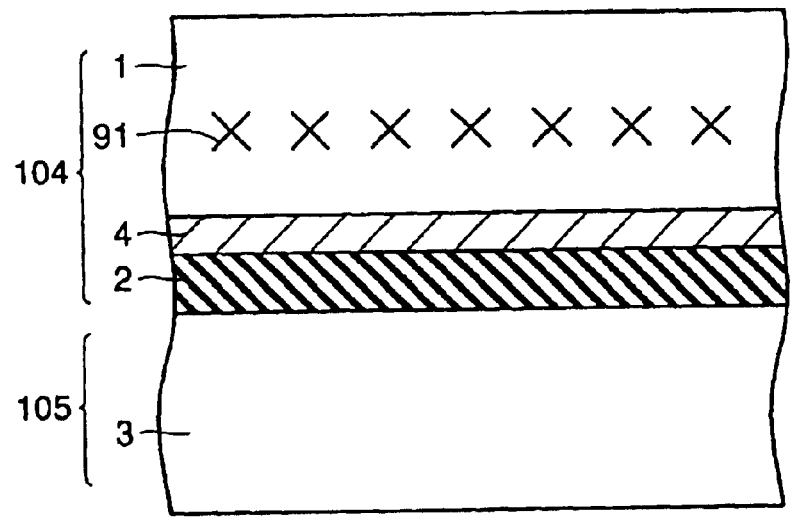
FIGS. 46 and 47 illustrate the fifth and sixth manufacturing steps respectively in the tenth embodiment of the invention.
Figure 47:
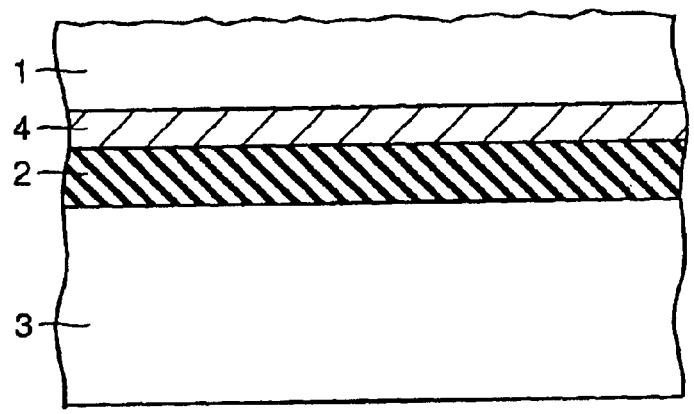

Referring to FIG. 46, upper wafer 104 is turned upside down and overlaid on a lower wafer 105 formed of a silicon layer as shown in FIG. 45 to bond them together. The bonded upper and lower wafers 104 and 105 are annealed at 650° C. and then the temperature is maintained at 1100° C., and silicon layer 1 is separated at the position of defect containing layer 91 as shown in FIG. 47.

The remaining upper surface of silicon layer 1 is touch-polished to planarize the surface. Accordingly, the semiconductor wafer having the same structure as that in the first embodiment shown in FIG. 1 is completed.

Eleventh Embodiment

A method of manufacturing the semiconductor wafer in the second embodiment as shown in FIG. 6 is described, according to this embodiment which employs hydrogen implantation separation method, in conjunction with FIGS. 42, 48 to 50 and 45 to 47. The manufacturing step shown in FIG. 42 is similar to that in the first embodiment.

Figure 48:
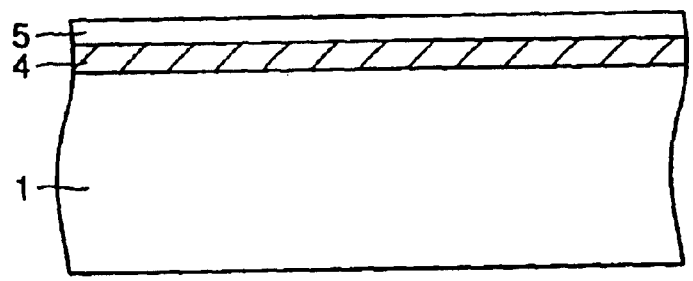
FIGS. 48 to 50 illustrate the third to fifth manufacturing steps respectively in the eleventh embodiment of the invention.

In the tenth and eleventh embodiments, referring to FIG. 48, an epitaxial silicon layer 5 is generated on the entire surface to a thickness of 3000 Å through epitaxial growth at 700 to 900° C. after the layer is made porous as shown in FIG. 42.

Figure 49:
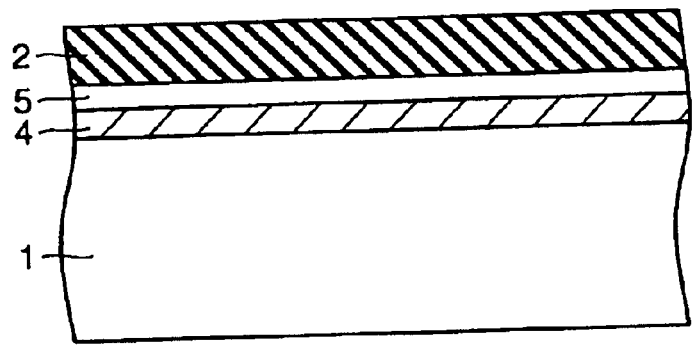
Figure 50:
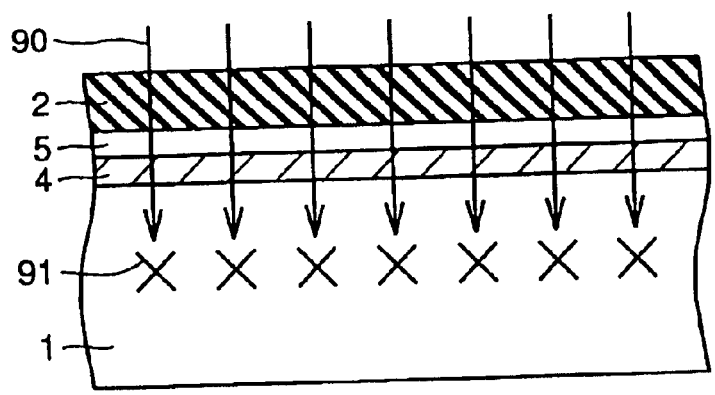

Referring to FIG. 49, an oxide film 2 is formed to a thickness of 2000 Å an, through thermal oxidation on the upper surface of epitaxial silicon layer 5. Referring to FIG. 50, hydrogen ions are implanted through the entire surface of the semiconductor wafer. The resultant product is used as an upper wafer to be subjected to the process steps as shown in FIGS. 45 to 47 in the first embodiment.

Accordingly, the semiconductor wafer having the same structure as that in the second embodiment shown in FIG. 6 is obtained.

Hydrogen ion implantation allows defect containing layer 91 to be produced at a depth away from the upper surface. At a depth where the concentration of implanted hydrogen is maximum, cracks are generated and the cracks are utilized to separate silicon layer 1. According to this method, the separated portion of the silicon substrate is reusable and thus the cost is reduced, which cannot be achieved by the method which decreases the thickness by polishing.

In this way, an SOI wafer having improved gettering ability can be fabricated at a low cost.

Twelfth Embodiment

According to this embodiment, a semiconductor wafer having an arbitrary multi-layer structure including an epitaxial silicon layer generated through epitaxial growth and a porous silicon layer is used as an upper wafer.

Figure 51:
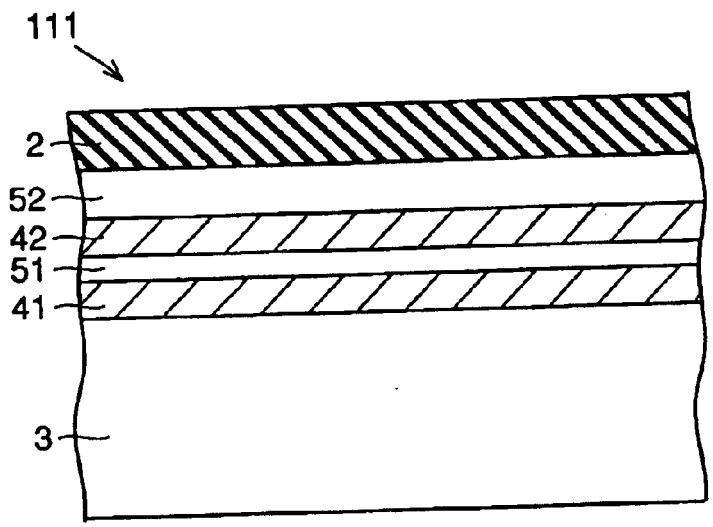
FIG. 51 illustrates an example of an upper wafer in the twelfth embodiment of the invention.
Figure 52:
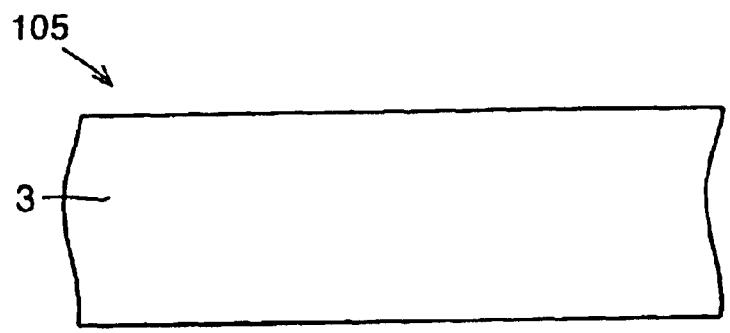
FIG. 52 illustrates a lower wafer used in the twelfth embodiment of the invention.

Referring to FIG. 51, for example, a semiconductor wafer including an oxide film 2, porous silicon layers 41 and 42, and epitaxial silicon layers 51 and 52 generated through epitaxial growth is employed as an upper wafer 111 and the upper wafer 111 is turned upside down and overlaid on a lower wafer 105 formed of a silicon layer 3 as shown in FIG. 52 so as to bond the upper and lower wafers together.

After that, any unnecessary portion of a silicon layer 1 is removed by polishing the upper side thereof to produce a semiconductor wafer having a structure in which a desired gettering layer is placed below oxide film 2.

After implementing a desired structure in the upper wafer, the upper wafer is bonded with the lower wafer. Therefore, even if the available lower wafer is formed of a silicon layer only, an SOI wafer having improved gettering ability can be manufactured efficiently.

The arbitrary multi-layer structure can increase the area of interfaces between layers. The interface generally functions effectively as a gettering site and thus the SOI wafer in this embodiment having increased area of interfaces between layers owing to the multi-layer structure is effective as an SOI wafer having gettering ability.

Thirteenth Embodiment

Figure 53:
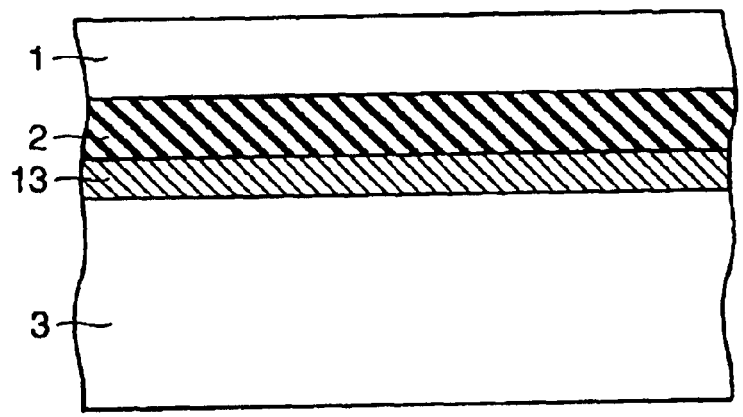
FIG. 53 illustrates a semiconductor wafer in the thirteenth embodiment of the invention.

Referring to FIG. 53, a semiconductor wafer of the invention has an oxide film 2 located above a silicon layer 3 via a low concentration impurity polycrystalline silicon layer 13 with a thickness ranging from about 0.01 μm to 3 μm and impurity concentration of $1 \times 10^{18}$ cm$^{-3}$ or less, and has a silicon layer 1 which is in contact with the upper side of oxide film 2.

In the semiconductor wafer in this embodiment, low concentration impurity polycrystalline silicon layer 13 located under oxide film 2 serves as a gettering layer.

Figure 60:
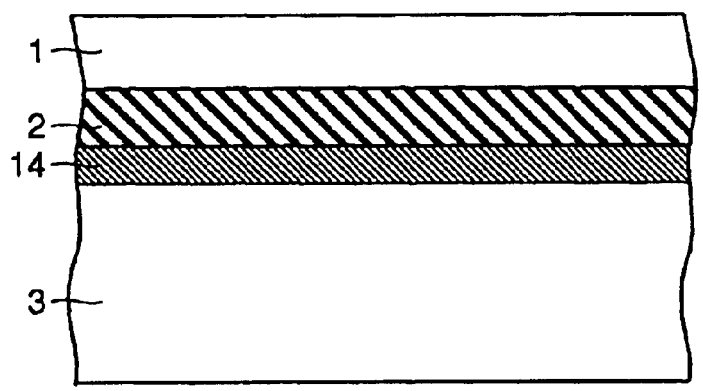
FIG. 60 illustrates an SOI wafer having improved gettering ability according to the conventional art.

According to the invention disclosed in Japanese Patent Laying-Open No. 8-116038, polycrystalline silicon layer 14 highly doped with phosphorus is used as shown in FIG. 60 instead of low concentration impurity polycrystalline silicon layer 13 of the present invention so as to improve gettering ability. The impurities of high concentration that are in contact with the lower side of oxide film 2 could diffuse into the silicon layer which constitutes a semiconductor device through the subsequent annealing in the process of fabricating the semiconductor device.

In this case, there arises an influence on the threshold voltage value of a transistor to be produced, leading to variation and inconsistency of the device characteristics. In order to prevent diffusion of impurities, the thickness of the oxide film should be increased, resulting in insufficient flexibility relative to the film thickness.

In the case of an RF (Radio Frequency) circuit, the concentration of impurities being in contact with the lower side of the oxide film should be decreased so as to decrease parasitic capacity.

According to the present invention, an advantage which cannot be achieved by the high concentration impurity polycrystalline silicon layer can be obtained while improvement of gettering ability is maintained. Specifically, it is possible to make the oxide film thinner and to decrease the parasitic capacity, and to have no influence on the silicon layer where the semiconductor device is fabricated.

Further, as a result of enhancement in gettering ability owing to the structure in this embodiment, prevention of junction leakage and improvements in reliability of the oxide film and in yield are accomplished as compared with the semiconductor wafer according to the conventional art.

Further improvement in the gettering ability of the semiconductor device is possible by placing the gettering layer in this embodiment under oxide film 2 of the semiconductor device in the first, second, fifth, sixth, seventh or eighth embodiment.

Fourteenth Embodiment

Figure 54:
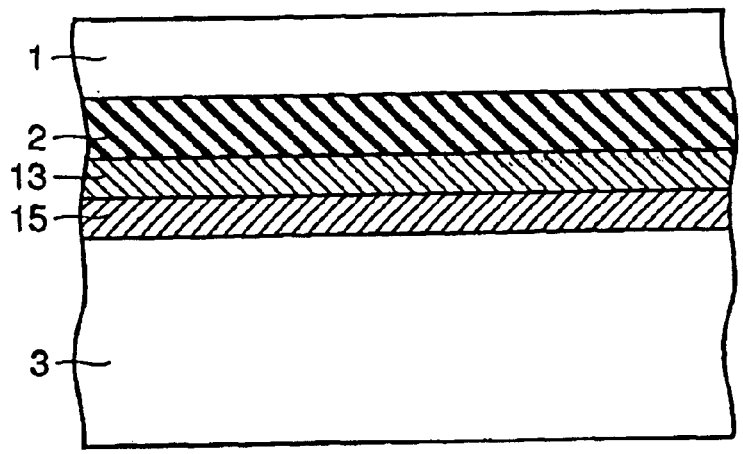
FIG. 54 illustrates a semiconductor wafer in the fourteenth embodiment of the invention.

Referring to FIG. 54, a semiconductor wafer in this embodiment has a polycrystalline or single crystal silicon layer 15 with a thickness of about 0.01 μm to 3 μm located in contact with the upper side of a silicon layer 3 and having a high concentration impurity region, a low concentration impurity layer 13 with a thickness of about 0.01 μm to 3 μm, an oxide film 2 in contact with the upper side of low concentration impurity layer 13, and a silicon layer 1 which is in contact with the upper side of oxide film 2.

Polycrystalline or single crystal silicon layer 15 may include a low concentration impurity region instead of the high concentration impurity region.

Polycrystalline or single crystal silicon layer 15 having the high concentration impurity region or the low concentration impurity region is thin enough as it has the thickness ranging from about 0.01 μm to 3 μm, so that the interfaces at both of the upper and lower sides thereof can be utilized for gettering to improve gettering ability. In addition, low concentration impurity layer 13 is placed between oxide film 2 and polycrystalline or single crystal silicon layer 15 having the high concentration impurity region or the low concentration impurity region, so that it is possible to prevent the influence due to diffusion of impurities into silicon layer 1 in the high temperature a process for fabricating a semiconductor device.

Fifteenth Embodiment

Figure 55:
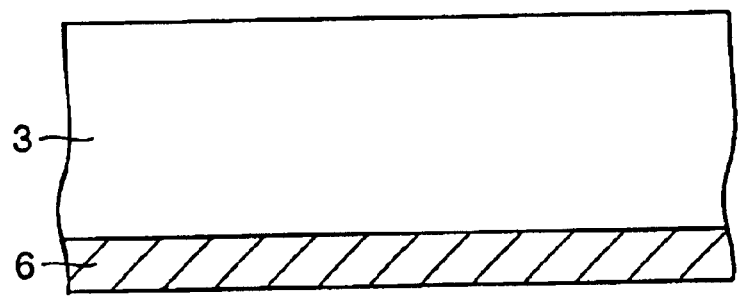
FIG. 55 illustrates a semiconductor wafer in the fifteenth embodiment of the invention.

Referring to FIG. 55, in a semiconductor wafer according to this embodiment, a porous silicon layer 6 is placed under a silicon layer 3, that is, on the back side of silicon layer 3. (The porous silicon layer is hereinafter referred to as "back side porous silicon layer.") Porous silicon layer 6 may be formed by those methods described in conjunction with respective embodiments presented above.

It is noted that any arbitrary structure may be employed as the structure placed on silicon layer 3 (not shown).

Figure 56:
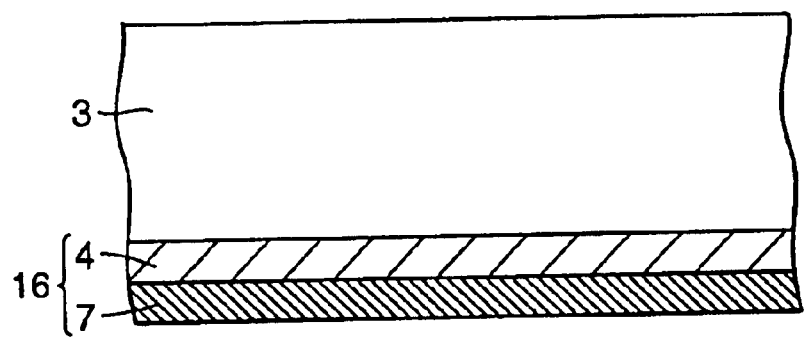
FIGS. 56 and 57 respectively illustrate the first and second examples of a two-layer structure of the semiconductor wafer in the fifteenth embodiment of the invention.
Figure 57:
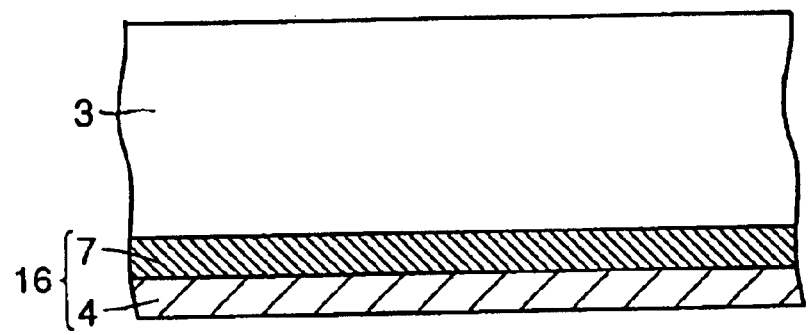
Figure 58:
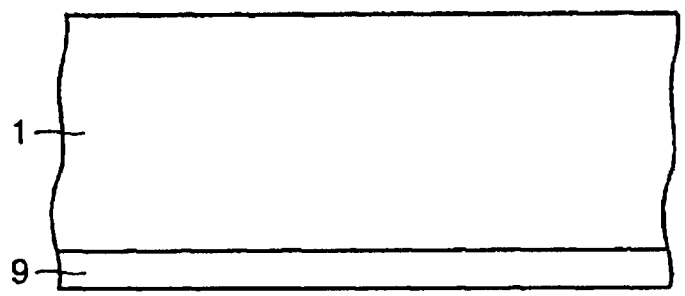
FIG. 58 illustrates a bulk silicon wafer according to a conventional art.
Figure 59:
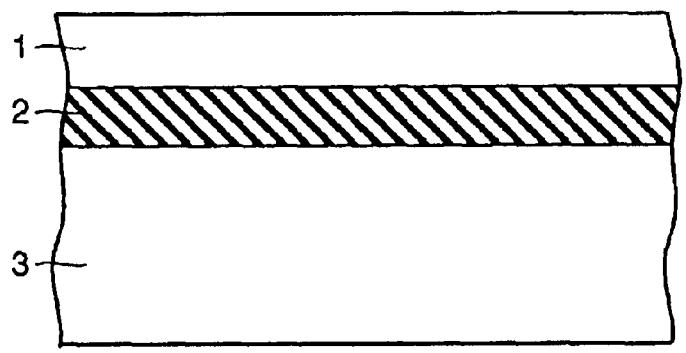
FIG. 59 illustrates an SOI wafer according to the conventional art.

Instead of back side porous silicon layer 6 located under silicon layer 3, a two-layer structure 16 similar to two-layer structure 8 explained in conjunction with the eighth embodiment and shown in FIG. 32 may be provided. (The two-layer structure located on the back side is referred to as "back side two-layer structure.") A structure having the back side two-layer structure 16 is illustrated in FIGS. 56 and 57.

Back side porous silicon layer 6 or back side two-layer structure 16 may be placed only in a selected region as required. This structure can be implemented by the manufacturing method described in conjunction with the fifth and sixth embodiments.

Gettering ability of the semiconductor wafer can further be enhanced since back side porous silicon layer 6 or back side two-layer structure 16 functions as a gettering layer regardless of existence of the structure located on silicon layer 3.

However, if back side porous silicon layer 6 is exposed at the rear surface of the wafer, contaminants could be generated from the porous silicon portion. The contaminants could be generated through the process, leading to decrease of yield. Therefore, when the back side two-layer structure 16 is implemented, especially in the structure shown in FIG. 56, it is possible to prevent contaminants from being generated from back side porous silicon layer 6 since back side porous silicon layer 6 is not exposed at the rear surface of the wafer, and thus that structure is more desirable compared with those structures shown in FIGS. 55 and 57.

Although the oxide film is used as an insulating film in the embodiments above, an insulating film made of another material having the same function can be employed.

In the semiconductor wafer according to the present invention, the dangling bond portions of vacancies in the porous silicon layer contribute to gettering. Therefore, the porous silicon layer can serve as a gettering layer. Further, gettering can be conducted without being interrupted by the oxide film by placing the porous silicon layer above the oxide film. Accordingly, an SOI wafer with high gettering ability is achieved.

Following the method of manufacturing a semiconductor wafer according to the invention, an SOI wafer with high gettering ability can efficiently be manufactured to have the required number of porous silicon layers located at desired positions such as the location above the oxide film, through the bonding method or the like.

In addition, using the semiconductor wafer with gettering ability improved according to the present invention, it is possible to prevent junction leakage and to enhance reliability of the oxide film as well as yield, compared with the semiconductor wafer according to the conventional art.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate;

a semiconductor layer disposed on said semiconductor substrate with an insulating film interposed therebetween;

a gettering layer disposed above said insulating film and including a porous silicon layer; and a MOS transistor including source and drain regions formed at said semiconductor layer with a predetermined distance therebetween, a depletion layer extending from said source and drain regions and reaching its end before said porous silicon layer, wherein said gettering layer is in contact with an upper side of said insulating film.

2. The semiconductor device according to claim 1, further comprising a silicon layer which is in contact with a lower side of said gettering layer and with the upper side of said insulating film.

3. The semiconductor device according to claim 1, wherein said gettering layer has a two-layer structure including:

a first gettering layer formed of a porous silicon layer; and a second gettering layer formed of a polycrystalline silicon layer which has an impurity region containing impurities of high concentration that define n or p type such as phosphorus, arsenic, antimony, boron and indium or formed of a crystal defect containing layer.

4. The semiconductor device according to claim 1, wherein
said gettering layer is placed below said insulating film.

5. The semiconductor device according to claim 1, wherein
said gettering layer has a two-layer structure including:
a first gettering layer formed of a porous silicon layer; and
a second gettering layer formed of a polycrystalline silicon layer which has an impurity region containing impurities of high concentration that define n or p type such as phosphorus, arsenic, antimony, boron and indium or formed of a crystal defect containing layer, and
said gettering layer is in contact with a lower side of said insulating film.

6. The semiconductor device according to claim 1, wherein said semiconductor wafer includes a first region extending horizontally and provided with said porous silicon layer, and a second region without said porous silicon layer that is coplanar with respect to said first region.

7. A semiconductor device, comprising:
a semiconductor substrate;
a semiconductor layer disposed on said semiconductor substrate with an insulating film interposed therebetween;
a gettering layer disposed above said insulating film and including a porous silicon layer; and
a MOS transistor including source and drain regions formed at said semiconductor layer with a predetermined distance therebetween,
said source and drain regions or a depletion layer extending from said source and drain regions reaching said porous silicon layer, wherein
said gettering layer is in contact with an upper side of said insulating film.

8. The semiconductor device according to claim 7, further comprising a silicon layer which is in contact with a lower side of said gettering layer and with the upper side of said insulating film.

9. The semiconductor device according to claim 7, wherein
said gettering layer has a two-layer structure including:
a first gettering layer formed of a porous silicon layer; and
a second gettering layer formed of a polycrystalline silicon layer which has an impurity region containing impurities of high concentration that define n or p type such as phosphorus, arsenic, antimony, boron and indium or formed of a crystal defect containing layer.

10. The semiconductor device according to claim 7, wherein
said gettering layer is placed below said insulating film.

11. The semiconductor device according to claim 7, wherein
said gettering layer has a two-layer structure including:
a first gettering layer formed of a porous silicon layer; and
a second gettering layer formed of a polycrystalline silicon layer which has an impurity region containing impurities of high concentration that define n or p type such as phosphorus, arsenic, antimony, boron and indium or formed of a crystal defect containing layer.

12. The semiconductor device according to claim 7, wherein said semiconductor wafer includes a first region extending horizontally and provided with said porous silicon layer, and a second region without said porous silicon layer that is coplanar with respect to said first region.

13. A semiconductor wafer comprising:
a semiconductor substrate;
an insulating film provided over a surface of said semiconductor substrate; and
a gettering layer provided on the surface of said semiconductor substrate,
said gettering layer including
a low concentration impurity layer contacting a lower side of said insulating film and
a polycrystalline silicon layer or a single crystal silicon layer connecting a lower side of said low concentration impurity layer, having a thickness of about 0.01 $\mu$m to 3 $\mu$m and containing impurities of high concentration that define n or p type such as phosphorus, arsenic, antimony, boron and indium.

14. A semiconductor wafer comprising:
a gettering layer including a low concentration impurity polycrystalline silicon layer containing impurities with concentration of at most $1\times10^{18}$ cm$^{-3}$; and
an insulating film, wherein
said gettering layer is in contact with a lower side of said insulating film, and said gettering layer is in contact with an upper side of a silicon substrate.

* * * * *